(12) United States Patent
Hamburgen et al.

(10) Patent No.: US 10,514,724 B2
(45) Date of Patent: Dec. 24, 2019

(54) FOLDABLE DISPLAY NEUTRAL AXIS MANAGEMENT WITH THIN, HIGH MODULUS LAYERS

(71) Applicant: GOOGLE LLC, Mountain View, CA (US)

(72) Inventors: William Riis Hamburgen, Palo Alto, CA (US); Kiarash Vakhshouri, San Jose, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 16/362,126

(22) Filed: Mar. 22, 2019

(65) Prior Publication Data

US 2019/0324498 A1 Oct. 24, 2019

Related U.S. Application Data

(63) Continuation of application No. 16/003,938, filed on Jun. 8, 2018, now Pat. No. 10,268,238.
(Continued)

(51) Int. Cl.
*G06F 1/16* (2006.01)
*H01L 51/00* (2006.01)
(Continued)

(52) U.S. Cl.
CPC .......... *G06F 1/1616* (2013.01); *G06F 1/1626* (2013.01); *G06F 1/1652* (2013.01); *G06F 3/0412* (2013.01); *H01L 27/323* (2013.01); *H01L 51/0034* (2013.01); *H01L 51/0097* (2013.01); *H04M 1/0268* (2013.01); *H04M 1/0216* (2013.01)

(58) Field of Classification Search
CPC combination set(s) only.
See application file for complete search history.

(56) References Cited

U.S. PATENT DOCUMENTS

| | | | |
|---|---|---|---|
| 9,276,055 B1 * | 3/2016 | Son | H01L 27/3276 |
| 9,385,175 B2 * | 7/2016 | Son | H01L 27/3276 |

(Continued)

FOREIGN PATENT DOCUMENTS

| | | | | |
|---|---|---|---|---|
| TW | 201717448 A | 5/2017 | | |
| WO | 2016196180 A1 | 12/2016 | | |
| WO | WO-2016196180 A1 * | 12/2016 | ......... | H01L 51/0097 |

OTHER PUBLICATIONS

Office Action with English Translation for Taiwanese Application No. 107119906, dated Apr. 17, 2019, 17 pages.
(Continued)

*Primary Examiner* — Lisa Lea-Edmonds
(74) *Attorney, Agent, or Firm* — Brake Hughes Bellermann LLP

(57) ABSTRACT

A foldable display of a computing device includes a back stiffening layer, a transparent frontplate layer, a transparent cover window layer, and an OLED display layer disposed between the back stiffening layer and the transparent frontplate layer. The OLED display layer characterized by a Young's modulus that is lower than the Young's modulus of the transparent frontplate layer and that is lower than the Young's modulus of the back stiffening layer; a neutral plane of the foldable display is located within the OLED display layer.

18 Claims, 19 Drawing Sheets

Related U.S. Application Data

(60) Provisional application No. 62/517,137, filed on Jun. 8, 2017.

(51) Int. Cl.
    *H04M 1/02*         (2006.01)
    *H01L 27/32*        (2006.01)
    *G06F 3/041*        (2006.01)

(56) References Cited

U.S. PATENT DOCUMENTS

| | | | | |
|---|---|---|---|---|
| 9,425,418 B2 * | 8/2016 | Kwon | | H01L 27/3276 |
| 9,450,038 B2 * | 9/2016 | Kwon | | H01L 27/3276 |
| 9,515,099 B2 * | 12/2016 | Kwon | | H01L 27/1244 |
| 9,572,268 B2 * | 2/2017 | Yamazaki | | G09G 3/32 |
| 9,614,022 B2 * | 4/2017 | Miyake | | H01L 51/0097 |
| 9,864,411 B2 * | 1/2018 | Yamazaki | | G09G 3/32 |
| 9,865,844 B1 * | 1/2018 | Park | | H01L 27/322 |
| 10,114,419 B2 * | 10/2018 | Park | | G06F 3/044 |
| 10,198,040 B2 * | 2/2019 | Zhang | | G06F 3/0416 |
| 10,268,238 B2 * | 4/2019 | Hamburgen | | G06F 1/1626 |
| 2014/0098034 A1 | 4/2014 | Hack et al. | | |
| 2015/0023030 A1 * | 1/2015 | Tsukamoto | | G06F 1/1652 362/419 |
| 2016/0202782 A1 | 7/2016 | Park et al. | | |
| 2017/0060189 A1 * | 3/2017 | Sohn | | G06F 1/1652 |
| 2017/0153671 A1 * | 6/2017 | Yamazaki | | G09G 3/32 |
| 2017/0336831 A1 * | 11/2017 | Zhang | | G06F 3/0416 |
| 2018/0342699 A1 * | 11/2018 | Son | | H01L 27/3276 |
| 2018/0348821 A1 * | 12/2018 | Hamburgen | | G06F 1/1641 |
| 2018/0356859 A1 * | 12/2018 | Hamburgen | | G06F 1/1626 |

OTHER PUBLICATIONS

International Search Report and Written Opinion for International Application No. PCT/US2018/036718, dated Nov. 22, 2018, 19 pages.

* cited by examiner

FOLDABLE DISPLAY NEUTRAL AXIS MANAGEMENT WITH THIN, HIGH MODULUS LAYERS

CROSS-REFERENCE TO RELATED APPLICATIONS

This application is a continuation of U.S. application Ser. No. 16/003,938, filed Jun. 8, 2018 which claims the benefit of U.S. Provisional Application No. 62/517,137, filed on Jun. 8, 2017, both of which are incorporated by reference herein in their entireties.

TECHNICAL FIELD

This description relates to thin foldable displays and, in particular, to thin film foldable displays in which the neutral axis of the display is precisely controlled to reduce mechanical stress on the display.

BACKGROUND

Modern computing devices often attempt to achieve a balance between portability and functionality. A tension can exist between having a display that provides for a rich display of information on a single surface, which suggests a relatively large form factor of the device to accommodate a relatively large display, and a device that is small enough to be easily carried and accessed by a user, which suggests a relatively small form factor of the device.

A potential solution to address this dilemma is to use a foldable flexible display in the computing device, so that in the display's folded configuration, the computing device has a relatively small form factor, and in the display's unfolded configuration, the computing device can have a relatively large display. To keep the form factor of the computing device small and slim, it is desirable to have relatively thin displays. However, folding a relatively thin display can result in small radius bends at the fold in the display, which may be detrimental to sensitive components of the display, for example, thin film transistors (TFTs), organic light-emitting diodes (OLEDs), thin-film encapsulation (TFE) and the like. In addition, thin displays can be relatively fragile and in need of protection against breakage from impacts to the front surface of the device.

It can be difficult to create foldable top-emitting plastic OLED displays that have a small folding radius in both directions (i.e., having two surfaces of the display fold both towards each other and away from each other) and that can survive many fold-unfold cycles. In particular, creating sturdy, durable Z-fold displays (i.e., displays with both inward and outward folds) is greatly complicated by the fragility of the thin-film layers in the display stack.

One approach is to building the stack of layers for a functional display is to use optically clear adhesive (OCA) to join different functional layers of the stack. For example, a display stack may include from the following layers:

1. Backplate layer
2. Adhesive layer
3. Display layer (including polyimide substrate with barrier, TFT, OLED, and encapsulation layers)
4. OCA layer
5. Touch sensitive layer (typically a multi-layer film stack)
6. OCA layer
7. Polarization layer (including a circular polarizer)
8. OCA layer
9. Cover Window (CW) layer (user-facing cover window film)

In some implementations, the polarization layer and the touch sensitive layer may be reversed, combined or eliminated. A common development direction involves building touch functionality directly on top of the display layer. This reduces the thickness of the stack of the most fragile layers and also simplifies electrical connection to the touch layer. In such implementations, the stack may include the following layers:

1. Backplate layer
2. Adhesive layer
3. Display-Touch layer
4. OCA layer
5. Polarization layer (including a circular polarizer)
6. OCA layer
7. CW layer (user-facing cover window film)

In another implementation, the cover window layer and the polarization layer can be combined, so that the stack includes the following layers:

1. Backplate layer
2. Adhesive layer
3. Display-Touch layer
4. OCA layer
5. POL-CW layer The Display-Touch layer often is manufactured in a very expensive, highly-automated OLED factory using a highly optimized recipe that cannot easily be altered to meet customer customer-specific requirements. The backplate and polarization/cover window layers may be customer-specific and are typically added in a less expensive factory setting after the display exits the OLED line. However, these customer-specific backplate layer and polarization/cover window layers may cause the neutral plane of the device to shift away from the display-touch layer, which may be detrimental to the in-system folding cycle life of the entire display.

Thus, foldable display devices in which the neutral plane of the device is in, or close to, the most fragile display layers, are desirable.

SUMMARY

In one general aspect, a foldable display of a computing device includes a back stiffening layer, a transparent frontplate layer, a transparent cover window layer, and an OLED display layer disposed between the back stiffening layer and the transparent frontplate layer. The OLED display layer characterized by a Young's modulus that is lower than the Young's modulus of the transparent frontplate layer and that is lower than the Young's modulus of the back stiffening layer; a neutral plane of the foldable display is located within the OLED display layer.

Implementations can include one or more of the following features, alone, or in any combination with each other. For example, the transparent front plate can include glass fibers and polymer materials. A touch layer can be disposed between the back stiffening layer and the transparent frontplate layer. The OLED display layer and the touch layer can be fabricated as a single layer. There can be no layers between the back stiffening layer and the single layer. There can be no layers between the transparent frontplate and the single layer.

The OLED display layer can be configured to be bent repeatedly to a radius of less than 10 mm. A neutral plane of the foldable display can be located within a middle 50% of the OLED display layer. A neutral plane of the foldable display can be located within a middle 20% of the OLED display layer. An optically clear adhesive layer can be located between the OLED display layer and the transparent frontplate layer. The foldable display can be configured to be folded at a first location in a first direction and can be configured to be folded at a second location in a second direction that is opposite to the first direction.

In another general aspect, a computing device can include memory configured for storing executable instructions, a processor configured for executing the instructions, and a foldable display configured for displaying information in response to the execution of the instructions. The foldable display can include: a back stiffening layer, a transparent frontplate layer a transparent cover window layer, and an OLED display layer disposed between the back stiffening layer and the transparent frontplate layer. The OLED display layer can be characterized by a Young's modulus that is lower than the Young's modulus of the transparent frontplate layer and that is lower than the Young's modulus of the back stiffening layer, wherein a neutral plane of the foldable display is located within the OLED display layer. The computing device also can include a bend limit layer arranged substantially parallel to the OLED display layer, with the bend limit layer being configured to increase its stiffness non-linearly when a radius of a bend of the bend limit layer is less than a threshold radius of curvature of the foldable display layer, the threshold radius of curvature being greater than 1 mm and less than 20 mm.

Implementations can include one or more of the following features, alone, or in any combination with each other. For example, a coupling layer can be disposed between the bend limit layer and the OLED display layer, with the coupling layer having a Young's modulus lower than the Young's modulus of the OLED display layer. The bend limit layer can include a material having a coefficient of thermal expansion within 50% of the coefficient of thermal expansion of the OLED display layer. The bend limit layer can include a material having a coefficient of thermal expansion within 25% of the coefficient of thermal expansion of the OLED display layer. An overall thickness of the foldable display is less than one millimeter.

The computing device can also include a touch layer disposed between the back stiffening layer and the transparent frontplate layer. The OLED display layer and the touch layer can be fabricated as a single layer. A neutral plane of the foldable display can be located within a middle 50% of the OLED display layer. A neutral plane of the foldable display is located within a middle 20% of the OLED display layer. The computing device can include an optically clear adhesive layer between the OLED display layer and the transparent frontplate layer. The foldable display can be configured to be folded at a first location in a first direction and can be configured to be folded at a second location in a second direction that is opposite to the first direction.

DETAILED DESCRIPTION

As described herein, to control the location of the neutral plane in the final display device, after fabrication of the display-touch layer, a thin back stiffening layer and a thin transparent frontplate layer, both having high modulus, can be laminated with thin bondlines or deposited on either side of the display-touch layer. By sandwiching the delicate display-touch layers between two stiff outer layers, the location of the neutral plane can be stabilized, and subsequent layers that are added on either side can have less influence on the neutral axis location, thus improving in-system reliability. In implementations, the back stiffening layer can be combined with the backplate layer to create a surface-stiffened backplate layer.

Figure 1:
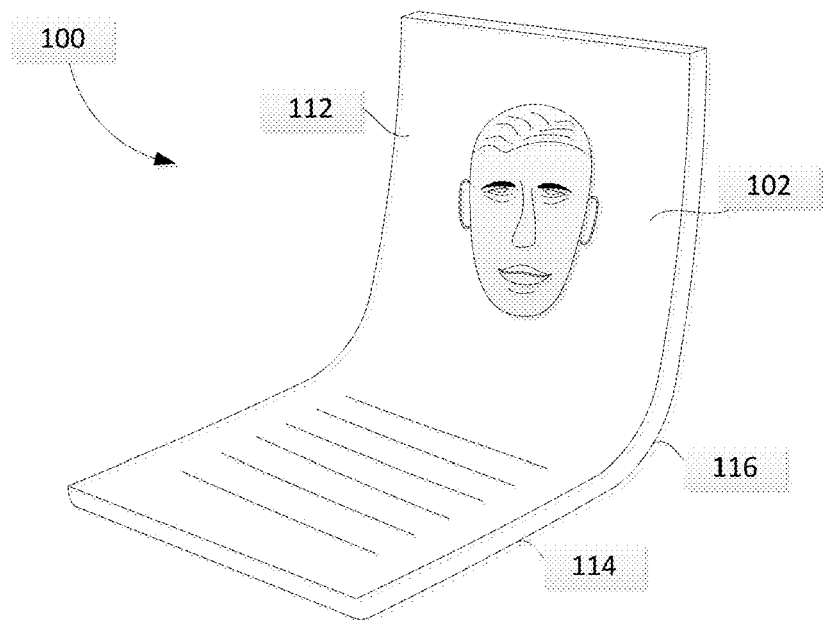
FIG. 1 is a perspective view of a computing device that includes a foldable display with a single inward fold and the foldable display in a partially folded configuration.
Figure 2:
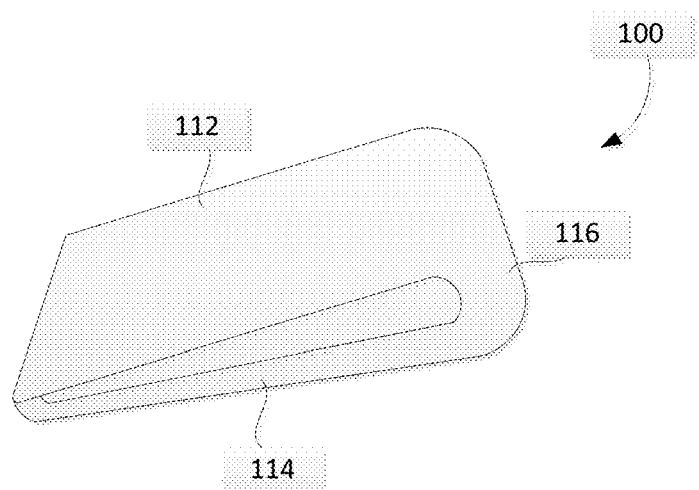
FIG. 2 is a perspective view of the computing device with a single inward fold, with the display in a folded configuration.

FIG. 1 is a perspective view of a computing device 100 that includes a foldable display with a single inward fold and the foldable display 102 in a partially folded configuration. The device 100 has the foldable display 102 mounted so that it folds with the viewable face inward. It is also possible to mount the foldable display 102 on the opposite side of device 100 so that the display folds with viewable face outward (not shown). FIG. 2 is a perspective view of the computing device 100, with the display 102 in a folded configuration. The foldable display 102 may be, for example, a TFT (Thin-Film-Transistor) OLED (Organic Light Emitting Diode) display, or other appropriate display technology. The foldable display 102 may comprise appropriate circuitry for driving the display to present graphical and other information to a user.

As shown in FIG. 1 and FIG. 2, the foldable display 102 can include a first relatively flat rigid, or—semi-rigid, section 112, a second flat rigid section 114, and a third bendable section 116. In some implementations, the foldable display 102 can include more than two flat rigid sections 112, 114 and more than one bendable section 116. In some implementations, the foldable display 102 can include zero, or only one, flat rigid section 112, 114. For example, when a foldable display 102 includes zero flat rigid sections, the display 102 can be continuously bendable, and can be rolled up, as in a scroll. The foldable display 102 shown in FIG. 1 and FIG. 2 has a bendable section 116 that allows the foldable display to bend about an axis. In other implementations, the foldable display 102 can include bendable sections that allow the blade to bend about more than one axis.

The bendable section 116 of the foldable display 102 allows the display 102 to bend in an arc that has a radius, and the bendable section can be made to become rigid when the radius of the bendable section reaches a specified minimum radius. This minimum radius may be selected to prevent the display from bending in a radius so small that fragile components of the display would be broken. In some implementations, the minimum radius is greater than or equal to 2.5 millimeters, or greater than or equal to 3.0 millimeters, or greater than or equal to 5 millimeters. Thus, the bendable section can be flexible when bent in a radius greater than the minimum radius and then become rigid when the bend radius is equal to or smaller than the minimum radius.

Figure 3:
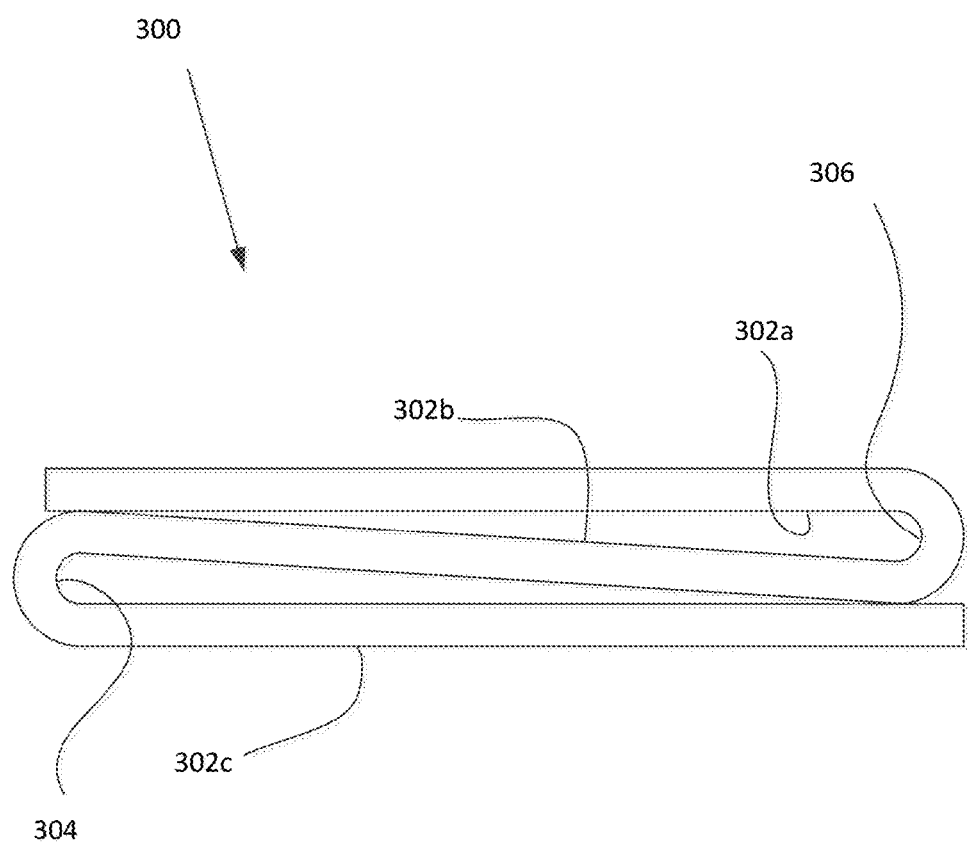
FIG. 3 is a schematic diagram of a flexible display device having a plurality of bendable sections that are bendable in different directions.

FIG. 3 is a schematic diagram of a flexible display device 300 having a plurality of bendable sections 304, 306 that are bendable in different directions. The flexible display device 300 can have a display surface 302a, 302b, 302c that can take on a "Z" shaped when the device is folded in its folded, compact configuration, with a portion of the display surface 302a, 302b folded inward with the surfaces 302a, 302b facing each other, and a portion of the display 302c folded outward. To assume the "Z" shaped configuration, the display device 300 can be have a bendable section 304 that is bendable in a clockwise direction, as shown in FIG. 3, and a bendable section 306 that is bendable in a counter-clockwise direction, as shown in FIG. 3.

Figure 4:
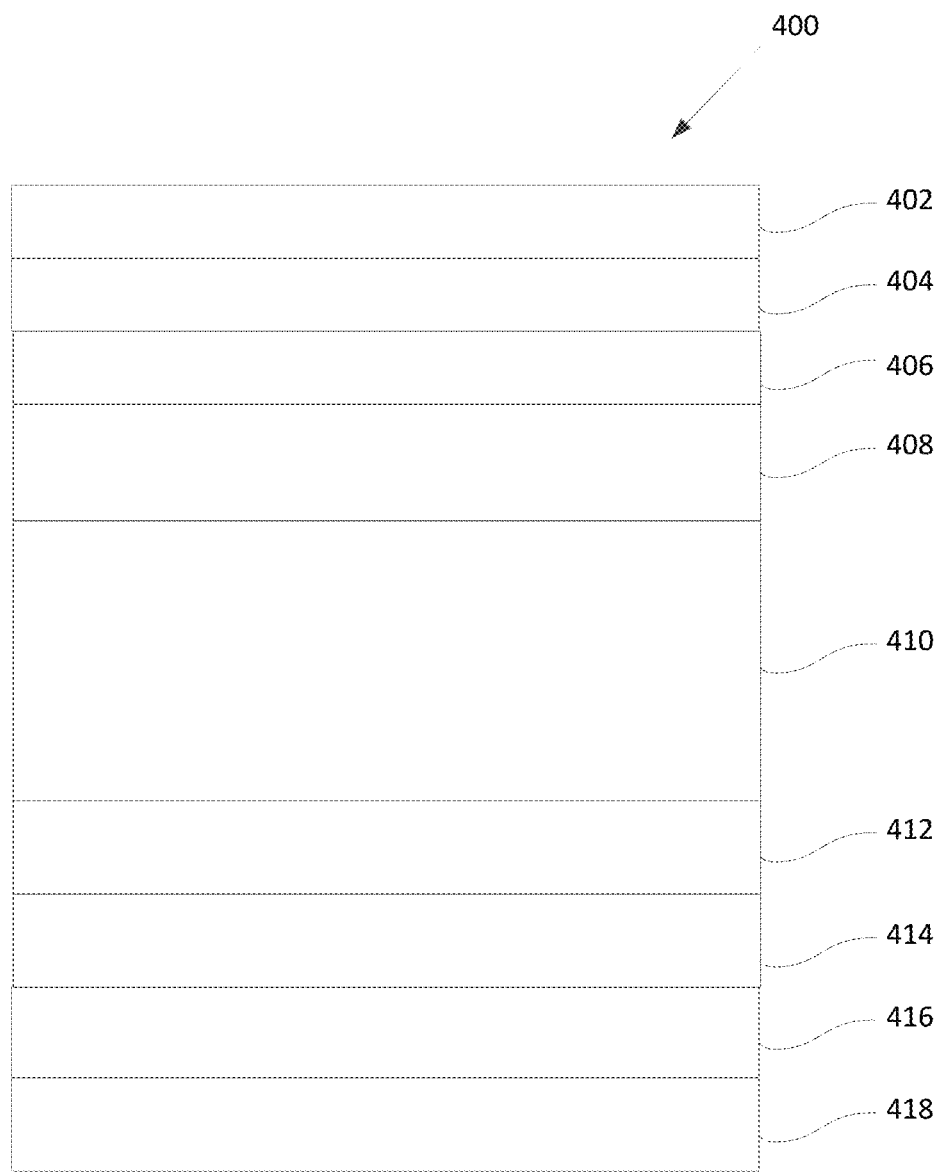
FIG. 4 is a schematic diagram of a flexible display device having a stack of a number of different layers.

FIG. 4 is a schematic diagram of a flexible display device 400 having a stack of a number of different layers. For example, in some implementations, a flexible organic light-emitting diode (OLED) layer 410 can be sandwiched between a back stiffening layer 414 and a transparent frontplate layer 406. The OLED layer 410 can include, at least, OLED functionality to generate the visual information displayed by the display device 400. In some implementations, the OLED layer 410 can also include touch-sensitive elements to detect a user's touch at particular locations on the display device 400 and to generate electrical signals in response to the detected touch, and in some implementations, a layer (not shown in FIG. 4) separate from the OLED layer 410 can include the touch-sensitive elements Furthermore, in some implementations, the OLED layer 410 can include other functional elements of the display device 400, such as, for example, TFTs, and encapsulation layer, and anti-reflection optical elements to reduce glare from the display, but in some implementations these functional elements can be included in separate layers from the OLED layer. In some implementations, the OLED layer 410 can be coupled to the frontplate layer 406 by an optically clear adhesive (OCA) layer 408. An optically clear adhesive layer 404 can be applied to a front surface of the frontplate layer 406 to couple the frontplate layer 406 to a cover window film layer 402 that serves to protect the device on the front side. In general, different adjacent discrete layers of the device 400 can be joined by an adhesive material between the adjacent materials. Adhesive material between an optical path from the OLED emitters of the OLED layer 410 and user's eye are OCA.

In some implementations, the OLED layer 410 can be coupled to the back stiffening layer 414 by an adhesive layer 412. In some implementations, the OLED layer 410 can be directly deposited on the back stiffening layer 414. In some implementations, the back stiffening layer 414 can be coupled to a backplate layer 418, for example, by an adhesive layer 416, or can be directly bonded to the backplate layer 418. In some implementations, the back stiffening layer 414 can be combined with the backplate layer 418 to form an integrated a surface-stiffened backplate layer. As explained in more detail below, the mechanical properties of the back stiffening layer 414 and the frontplate layer 406 can be controlled to manage the location of the neutral axis of a finished product that incorporates the display device 400.

Because the thickness of each layer of the stack is important to the overall thickness of the device 400, it is desirable to have a relatively thin thickness for the layers. For example, in some non-limiting examples, the thickness of the flexible OLED layer 410 can be on the order of approximately 50 µm; the thickness of frontplate layer 406 and the back stiffening layer 414 can be on the order of approximately 50 µm; the thickness of the optically clear adhesive layers 404, 408, 412 can be on the order of approximately 25 µm; the thickness of the cover window layer 402 can be on the order of approximately 100 µm; and the thickness of the backplate layer can be on the order of approximately 25 µm. Thus, an overall thickness of the device 400 can be on the order of a millimeter and the device can have layers with individual thicknesses that are fractions of a millimeter. In some implementations, the overall thickness of the display device 400 can be less than one millimeter.

The components of the stack of the device 400 have different as-fabricated properties, including stresses and strains that exist in the components when the layer is fabricated. Additional stresses and strains can be induced in the layers of the stack when the display is bent into a configuration that is different from the configuration in which the layer was fabricated. For example, if the layer was flat when it was fabricated, then additional strain can be induced by stretching or bending the layer, and if the layer was fabricated in a curved configuration, then additional strain can be induced by flattening the layer. If the bend-induced strain exceeds a threshold value characteristic of a component of the stack, the component can be damaged by the strain due to cracking, buckling, delamination, etc. This characteristic damage threshold strain may be different depending on temperature, humidity, required cycle life, and other use and environmental factors. Brittle inorganic layers of the stack can typically withstand less strain than inorganic layers before they are damaged by the strain. Nevertheless, organic materials in the stack also can be damaged by excessive strain that is induced by bending.

Figure 5:
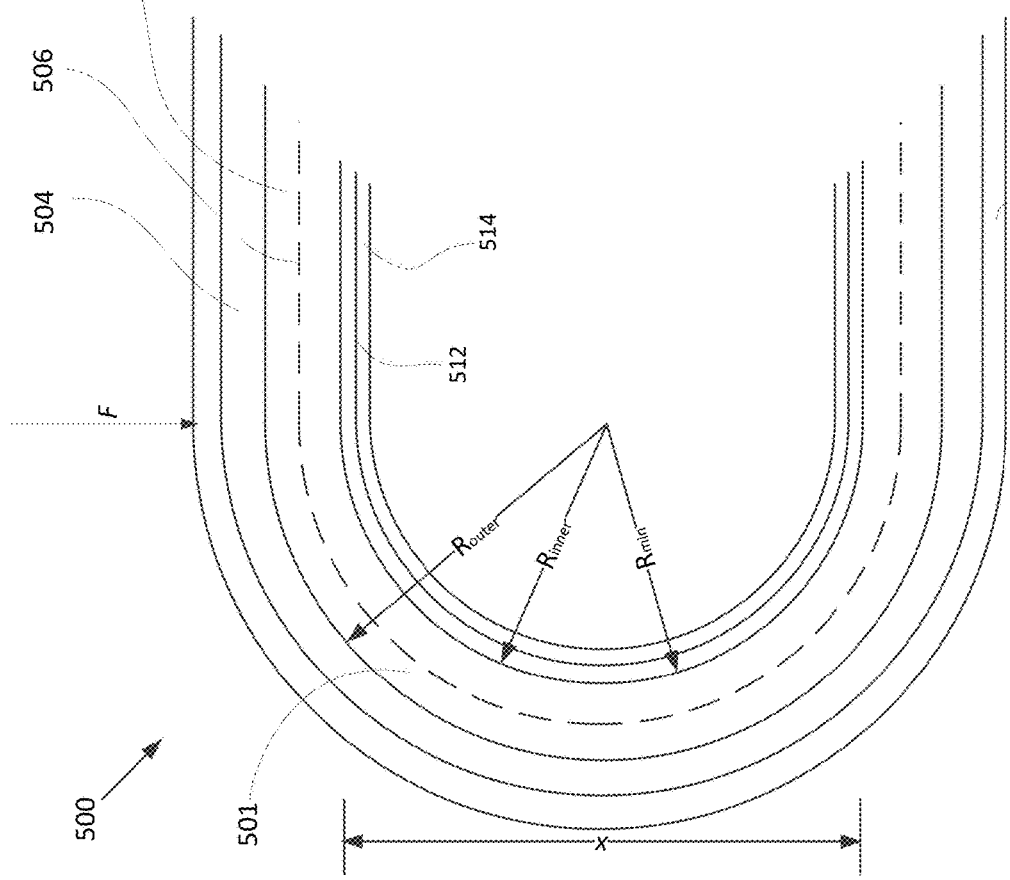
FIG. 5 is a schematic diagram of a foldable display having a bendable section that is bent around a minimum radius, $R_{min}$.

FIG. 5 is a schematic diagram of a foldable display 500 having a bendable section 501 (the curved portion shown in FIG. 5) that is bent around a minimum radius, $R_{min}$. The foldable display 500 can include an OLED layer 502 that includes components that generate images on the display (emitted from the side of the display that faces toward the inside of the bend), a high-modulus back stiffening layer 504, a high-modulus frontplate layer 512, and a cover window-polarization layer 514. The frontplate layer can be coupled to the OLED layer 502 and to the cover window-polarization layer 514 with OCA. The back stiffening layer 504 can be coupled to the OLED layer with an adhesive, which does not need to be OCA. The modulus of the layers 502, 504, 512 can be parameterized by the Young's modulus of the layer. The modulus of the back stiffening layer 504 and the frontplane layer 512 can be greater than then modulus of the OLED layer 502. The display 500 can also include a bend limit layer 520 that limits the radius at which the foldable display 400 can bend to greater than or equal to the minimum radius, $R_{min}$.

When the OLED layer 502 is fabricated in a flat configuration, then bending the OLED layer 502 in the absence of the bend limit layer 520 may cause the bendable section to assume a radius less than the minimum radius, $R_{min}$, which may induce excessive strain within the OLED layer 502. The OLED layer 502 can be characterized by a plane 506 at which no strain is induced when the OLED layer 502 is bent. This plane is referred to herein as the "neutral plane" 506. When the OLED layer 502 is bent and the neutral plane is in the middle of the OLED layer 502, compressive strain may be induced along the inner radius of the bend, $R_{inner}$, and tensile strain will be induced along the outer radius of the bend, $R_{outer}$.

If the stack of materials and material thicknesses within the device 500 is symmetrical about a midplane of the OLED layer 502, then the neutral plane 506 corresponds to the midplane of the layer 502. However, different material properties (e.g., thickness, Young's modulus, etc.) of different layers within the device 500 can cause the neutral plane 506 to be displaced above or below the midplane of the OLED layer 502. For example, having a thick, high-modulus layer on only one side of the OLED layer 502 will move the neutral plane toward the high-modulus layer. The location of the neutral plane within the device 500, along with the maximum tolerable strain values of the materials within the layers of the device 500, determines the minimum bend radius that can be tolerated without causing damage to components within the device 500, especially fragile components in the OLED layer 502.

The bend limit layer 520 can be attached to the OLED layer 502 to provide support for the OLED layer 502 and also can prevent the OLED layer 502 from being bent around a radius that is smaller than its minimum tolerable bend radius. In some implementations, the functionality of the bend limit layer 520 can be combined in a single layer with the functionality of the back stiffening layer 504. The bend limit layer 520 can be reinforced with materials (e.g., reinforced with high-strength fibers) to provide strength and support for the device. Materials in bend limit layer can have a coefficient of thermal expansion (CTE) that is close to the CTE of the OLED layer 502, so that the fragile components are not unduly stressed by thermal cycling of the device 500. For example, while many fiber materials have CTE's that are close to zero or even negative, some ceramic fibers can have CTE's on the order of 8 ppm per Kelvin. Use of such fiber materials can improve thermal expansion matching to a wide range of structures, including OLED display layers. In some implementations, the CTE of the fibers can be within about 50% of the CTE of the OLED display layer 502. In some implementations, the CTE of the fibers can be within about 25% of the CTE of the OLED display layer 502. In some implementations, the CTE of the fibers can be within about 10% of the CTE of the OLED display layer 502.

Figure 6:
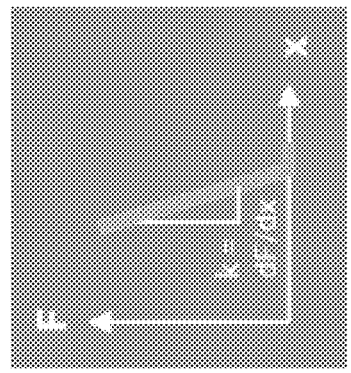
FIG. 6 is a graph showing an example stiffness curve for a foldable display in which the limit radius is reached when the foldable display is folded.

The bend limit layer 520 can be relatively flexible when it bent in radii such that the radius of the inner portion of the OLED layer 502 is greater than $R_{min}$ and then can become stiff and inflexible when the radius of the bend approaches, or matches, $R_{min}$. Stiffness can be parameterized by the change in bend radius per unit of applied force that causes the foldable display 500 to bend. For example, in FIG. 6, when the display is folded in half around a 180 degree bend, twice the radius of the bend is shown by the parameter, x, when a force, F, is applied to bend the foldable display. The stiffness of the foldable display 500 then can be parameterized by the derivative, k=dF/dx. The strength of the foldable display can be characterized as the maximum force, F, that the foldable display 500 can withstand before failure of the display occurs.

When the foldable display 500 is laid flat in its folded configuration, it can be maintained in its folded configuration by the force of gravity on the upper folded portion of the display, such that zero additional force is needed to be applied to the upper folded portion to maintain the foldable display in its flat folded configuration, or, in other implementations, additional force can be applied by external means such as latches, magnets, etc. to maintain the display in its folded configuration. In this configuration the radius of the bend can be defined as the limit radius, $R_{limit}$, i.e., the radius at which the back stiffening layer 504 limits the further bending of the foldable display unless additional external force is applied. To bend the foldable display further from this configuration requires additional external force to overcome the stiffness of the bend limit layer 520. Thus, an example stiffness curve for a foldable display in which the limit radius is reached with the foldable display is folded 180 degrees, showing stiffness as a function of x is shown in FIG. 5.

It can be advantageous to have a foldable display with a stiffness curve that exhibits a relatively sharp increase in stiffness once the limit radius is reached, such that the foldable display can be easily folded into its folded configuration in which $R_{limit}$ is close to $R_{min}$, and then the foldable display will become quite stiff, such that it remains in this configuration despite forces pressing it toward a radius smaller than $R_{limit}$.

Figure 7:
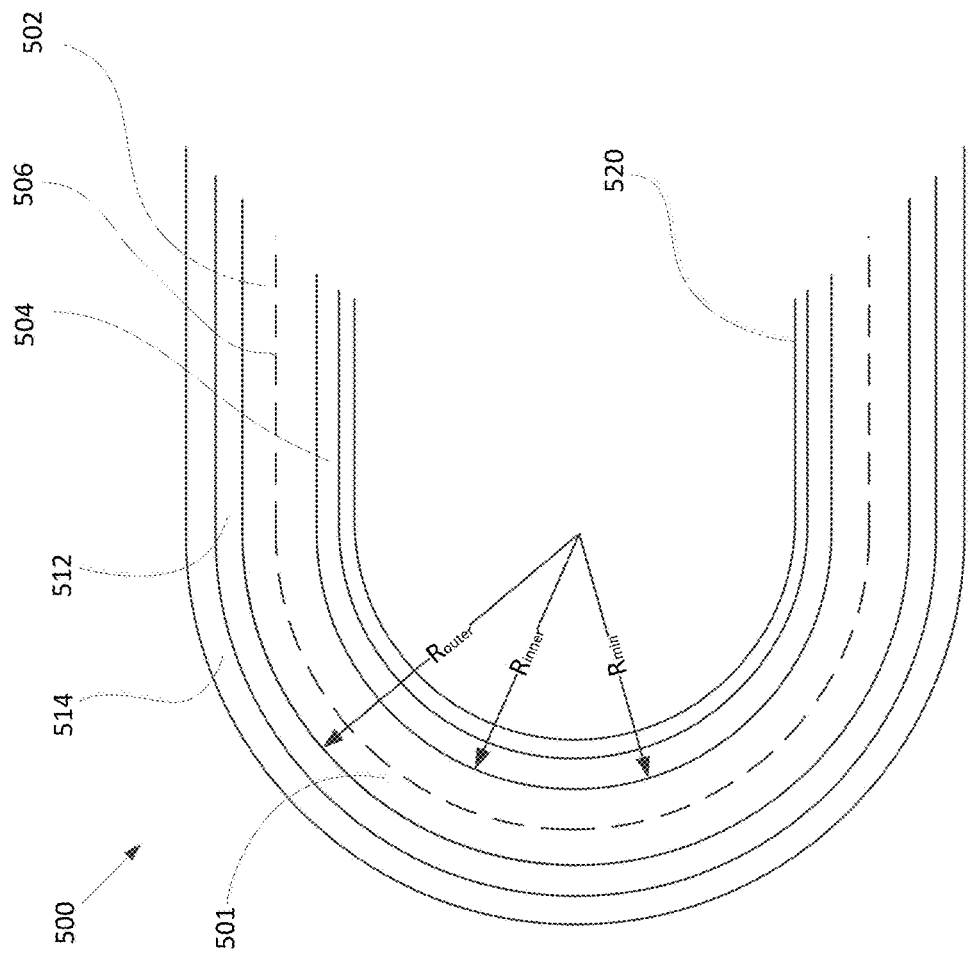
FIG. 7 is a schematic diagram of a foldable display having a bendable section that is bent around a minimum radius, $R_{min}$.

The bend limit layer 520 is shown on the outside of the bend in FIG. 5, with the OLED-display layer 502 being disposed in the stack toward the inside of the bend. However, the bend limit layer 520 also can be on the inside of the bend 501, for example, as shown in FIG. 7, in which case OLED layer 502 is on the outside of the bend and the content displayed by the display is on the outside of the bend 501.

In some implementations (particularly when the OLED layer 502, the CW layer 514 and the frontplate layer 512 are on the outside of the bend 501), glass used in one or more of the layers 502, 512, 514 can be fabricated to avoid the glass forming sharp shards when the glass is broken. For example, in one implementation, the glass used in one or more of the layers 502, 512, 514 can be treated with patterned ion-implantation (e.g., a grid pattern), so that when the glass breaks it is more likely to break along, or between, the pattern, thus avoiding sharp shards of glass.

The mechanical properties of the back stiffening layer 504, and the frontplate layer 512 can be controlled, so as to maintain the neutral plane 506 at, or close to the mid-plane of the fragile OLED layer 502, so that the OLED layer 502 can tolerate relatively small bend radii. Because other layers of the stack (e.g., the bend limit layer 520, the CW-polarization layer 514, etc.) can affect the location of the neutral plane 506 within the device 500, the mechanical properties (e.g., the thicknesses, densities, material composition, etc.) of the back stiffening layer 504 and the frontplate layer 512 must be selected in relation to those of other layers in the stack to maintain the neutral plane at or near the midplane of the OLED layer 506. In some implementations, the mechanical properties of the back stiffening layer 504, and the frontplate layer 512 can be controlled, so as to maintain the neutral plane 506 within the OLED layer. In some implementations, the mechanical properties of the back stiffening layer 504, and the frontplate layer 512 can be controlled, so as to maintain the neutral plane 506 within the middle 50% of the OLED layer. In some implementations, the mechanical properties of the back stiffening layer 504, and the frontplate layer 512 can be controlled, so as to maintain the neutral plane 506 within the middle 20% of the OLED layer.

Referring again to FIG. 4, the back stiffening layer 414 or the surface-stiffened backplate layer that includes the properties of the back stiffening layer 414 can be opaque since light from the OLED layer 410 does not need to be transmitted through it. Therefore, the back stiffening layer 414 can be made using a large variety of materials and processes. However, the frontplate layer 406 must be transparent, because light from the OLED layer 410 must be transmitted through it. Ordinary plastic films are ill-suited as materials for the frontplate layer 406, because their modulus is relatively low, and transparent oxide thin films can be too fragile. However, the frontplate layer 406 can be made from high-modulus, transparent composites, such as, for example, the glass-fiber and polymer materials disclosed Jin, J., et al. "Rollable Transparent Glass-Fabric Reinforced Composite Substrate for Flexible Devices," Adv. Mater. 22(40), 4510-4515 (2010), which is incorporated herein by reference. Other high-modulus, transparent materials, such as, for example, a thin glass layer (e.g., about 30 µm-50 µm thick), which may include high quality soda-lime or which may include ion-exchange strengthened alumino-silicate.

Because the frontplate layer 406 can be covered and protected by the CW-polarization layer 402, delicate materials of the transparent frontplate layer 406 that rely on being clean and defect-free to achieve the desired mechanical properties of the frontplate layer 406 can be protected during system assembly and end use. To additionally reduce surface damage and breakage during frontplate layer lamination, the glass can be supplied in roll format with a thin, adhesion-enhancing and protective polymer layer already applied on each side.

Figure 8A:
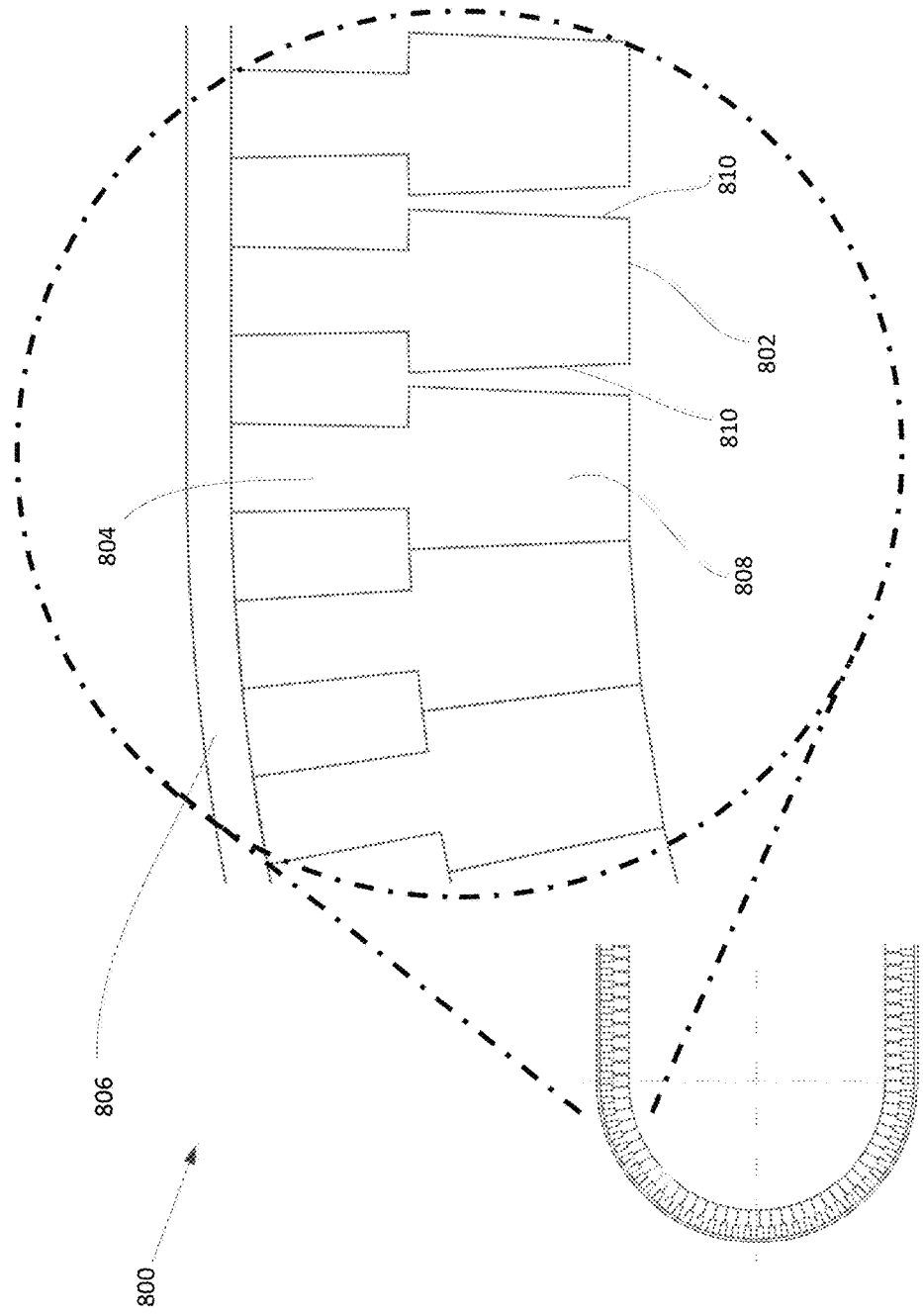
FIG. 8A is a schematic diagram of an example implementation of a bend limit layer.

FIG. 8A is a schematic diagram of an example implementation of a bend limit layer 800. The bend limit layer 800 can include a plurality of adjacent segments 802 that are each separated from neighboring segments for $R > R_{limit}$ and that are in contact with neighboring segments when $R \leq R_{limit}$. Each segment 802 can have a base portion 804 that is attached to a thin film 806 and a head portion 808 that is wider in a direction parallel to the plane of the bend limit layer 800 than the base portion 804. For example, the thin film 806 can be bent in radii of less than 3 mm. The thin film 806 has a thickness that is small compared with the height of the segments 806 in a direction perpendicular to the thin film 806. The stiffness of the thin film 806 is low, so that the bend limit layer 800 is easily bent for radii $R \geq R_{limit}$. The thin film 806 can be bent in radii small enough to accommodate the design parameters of the bend limit layer 800. In one non-limiting example, the thin film 806 can have a thickness of about 50 µm and when bent into a radius of 2.5 mm can experience a 1% strain. Of course, the thickness of the material can be adjusted to trade off advantages between different parameters, for example, the minimum radius of the thin film can be bent into, the strength of the thin film, and the stiffness of the thin film.

One example material that could be used is the polyimide film known as Kapton® HN available from DuPont in thicknesses of 7.6 µm, 12.7 µm, 25.4 µm 50.8 µm, etc. Another example material that could be used is a thin metal foil. For example, a 12 µm thick stainless steel foil has a strain of about 0.3% when bend into a radius of 2 mm.

In the example implementation shown in FIG. 8A, the bond line between the base portions 808 and the thin film 806 is covered by 50% of one surface of the thin film 806. In other words, half of the surface of the thin film 806 is attached to base portions 804 of adjacent segments 802, and half of the surface is unattached. Other configurations are also possible, in which the bond line coverage is more or less than 50%. The portion of the thin film 806 that is bonded to the adjacent segments 802 is much stiffer than the portions that are not bonded. This increases the stain in the unbonded portions of thin film 806, and this increase must be accounted for in the materials and geometry of the bend limit layer 800. With the head portions 808 being wider than the base portions 804, such that less than 100% of the thin film 806 is covered by the base portions 808, the portions of the thin film 806 between the base portions can flex and bend to allow the bend limit layer 800 to be bent to a small radius.

In some implementations, the base portions 804 of the adjacent segments 802 are not bonded to the thin film 806 continuously in a direction into the page, as shown in FIG. 8A, and base portions 804 of adjacent segments 802 are not bonded to the thin film 806 at locations shown in the cross section of FIG. 8A. Rather, bonding sites between the base portions 804 of adjacent segments 802 and the thin film 806 can be offset in the direction into the page, as shown in FIG. 8A.

Figure 8B:
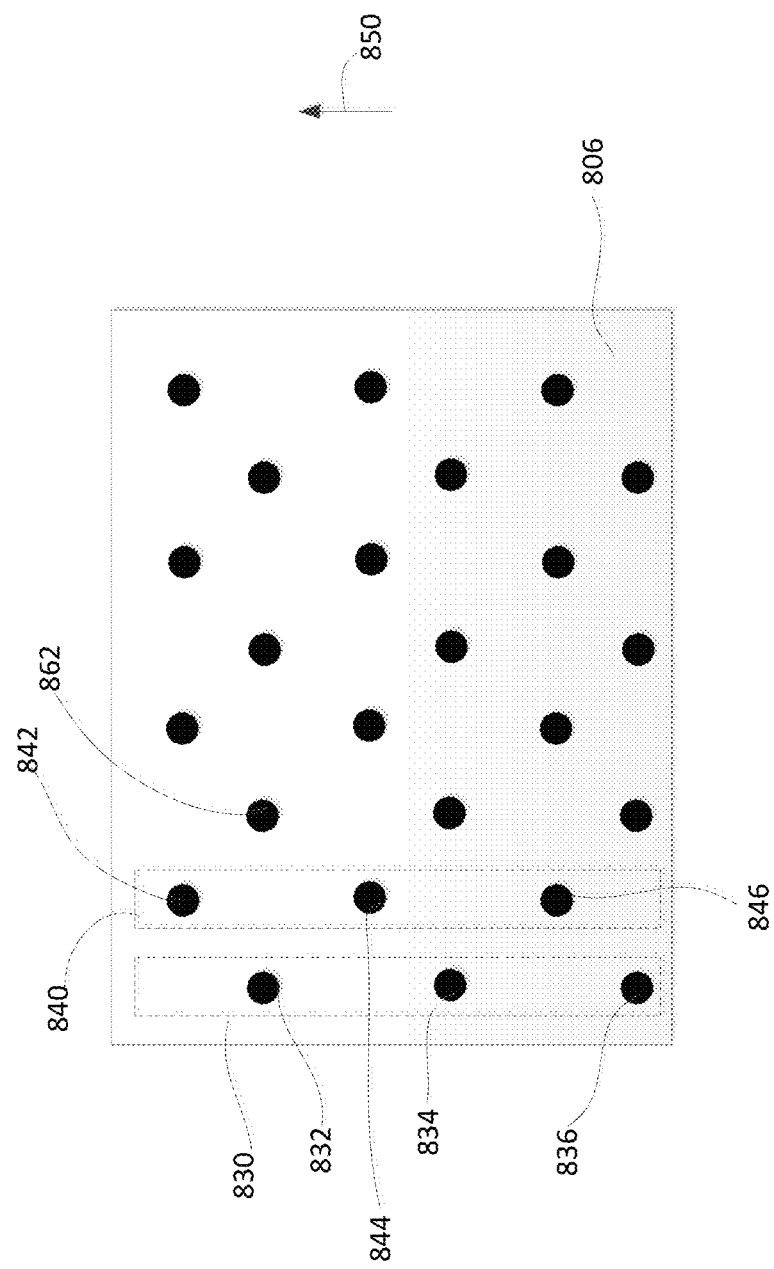
FIG. 8B is a top view of a thin film showing a plurality of bonding sites at which the film is bonded to the base portions of different adjacent segments.

FIG. 8B is a top view of the thin film showing a plurality of bonding sites at which the film 806 is bonded to the base portions 804 of different adjacent segments 802. For example, a first group 830 of bonding sites 832, 834, 836 can bond the film 806 to a first segment, whose footprint on the film 806 is shown by rectangle 830, and a second group 840 of bonding sites 842, 844, 846 can bond the film 806 to a second first segment, whose footprint on the film 806 is shown by rectangle 840. Because the bonding sites of adjacent segments are offset from each other along the direction 850, portions of the film 806 between adjacent segments that are not directly bonded to the segments can flex relatively easily when the bend limit film is bent into a small radius, as shown in FIG. 8A. For example, the film between bonding sites 832 and 862 that is under the second segment, whose footprint on the film 806 is shown by rectangle 840, can flex when the bend limit film is bent, even if the footprints 830 and 840 butt up against each other.

The head portion 808 of each segment 802 can have vertical sides 810 that, when the bend limit film 806 is flat, are not perfectly perpendicular to the thin film 806, but rather that are angled toward each other as they extend away from the thin film 806. Then, when the bend limit layer 800 is bent into a radius equal to $R_{limit}$, the vertical sides 810 of adjacent segments 802 become in intimate contact with, and parallel to, each other, so that they form a rigid, rugged layer of material that has a high stiffness for $R \leq R_{limit}$. Some means of fabricating the head portion 808 of each segment 802 may not have perfectly flat sides, but instead have other surface geometries that also allow both faces of adjacent segments 802 come in intimate contact with each other, so that they form a rigid, rugged layer of material that has a high stiffness for $R \leq R_{limit}$.

The segments 802 can be formed from a number of different materials including, for example, metals, polymers, glasses, and ceramics. Individual blocks can be molded, machined, drawn (e.g., through a shaped wire) and then attached to the thin film 806 at the correct spacing. In another implementation, a plurality of adjacent segments 802 can be formed simultaneously and then attached to the thin film 806.

Figure 9:
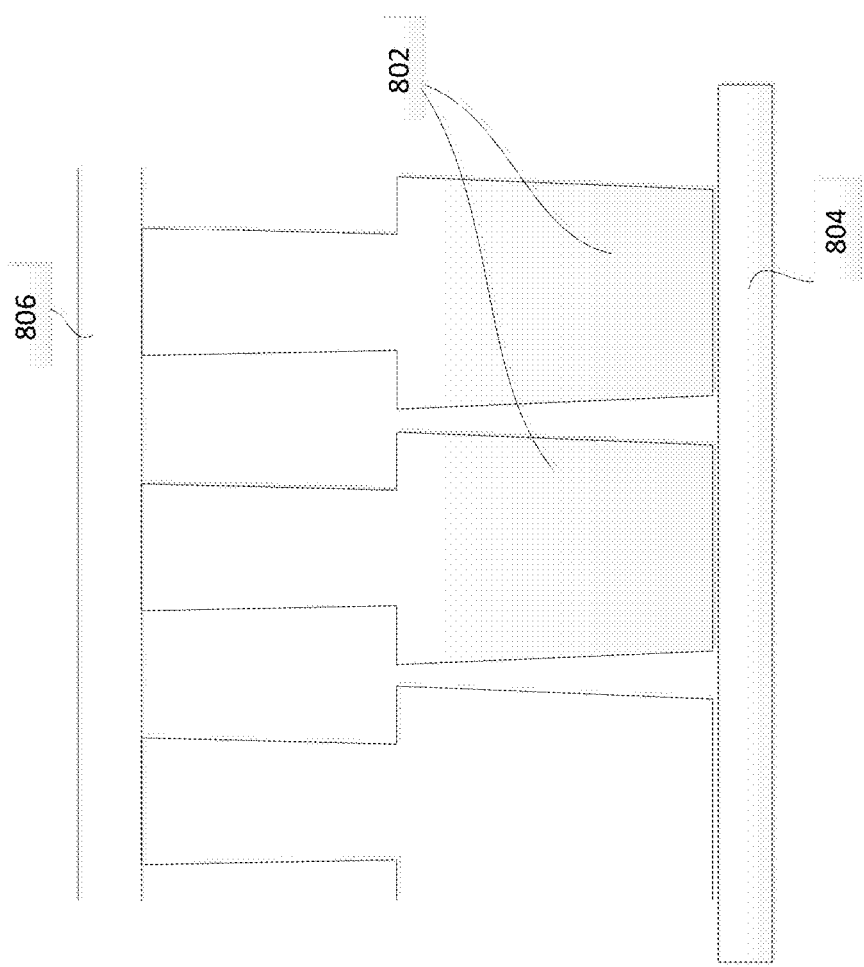
FIG. 9 is a schematic diagram of a plurality of adjacent segments for use in a bend limit film.

For example, as shown in FIG. 9, a plurality of adjacent segments 802 can be formed on a substrate 804, for example, by a single- or multi-step molding process, and then, after the segments 802 are bonded to the thin film 806, the substrate 804 can be broken, dissolved, or otherwise removed from the segments 802. In another implementation, the plurality of adjacent segments 802 can be formed on a substrate 804, for example, by a lithography and etching process, and then, after the segments 802 are bonded to the thin film 806, the substrate 804 can be broken, dissolved, or otherwise removed from the segments 802.

Figure 10:
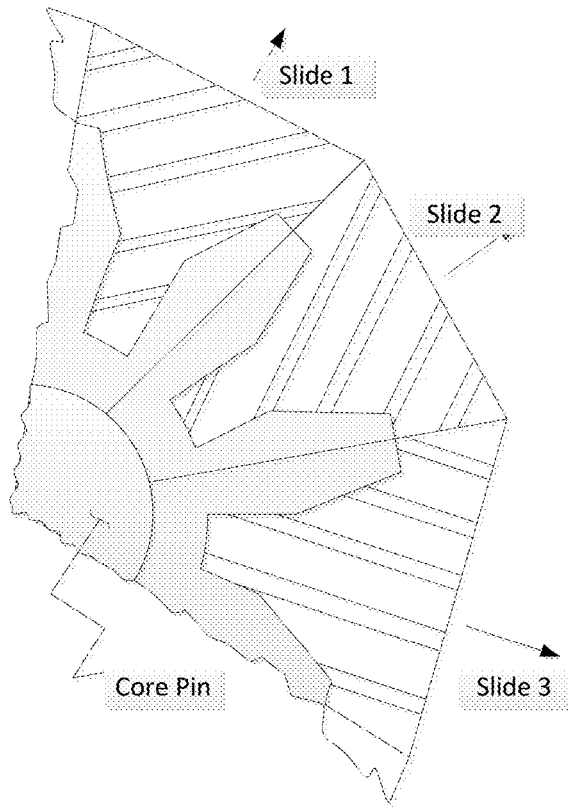
FIG. 10 is a schematic diagram of a rotating mold that can be used in an example molding process for forming the adjacent segments.

FIG. 10 is a schematic diagram of a rotating mold that can be used in an example molding process for forming the adjacent segments 802. For example, slides 1, 2, 3, etc. can be inserted radially into position with respect to a core pin, and then material can be injected into the voids between the slides and the core pin to simultaneously form the segments 802 and the thin film 806. As segments 802 are formed, the assembly can be rotated counter-clockwise and the slides can be removed in numerical order to free segments 802 from the counter-clockwise-most position in FIG. 9 while new segments are formed in positions clockwise from the counter-clockwise-most position. By using transparent tooling and an ultra-violet (UV) rapid-curing molding compound, high production throughput can be achieved.

Figure 11:
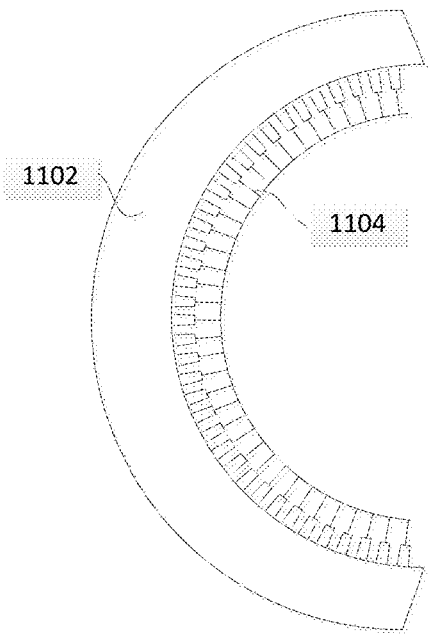
FIG. 11 is a schematic diagram of a mold that can be used for forming adjacent segments of a bend limit layer.

FIG. 11 is a schematic diagram of a mold 1102 that can be used for forming adjacent segments 802 of a bend limit layer 800. The shape of the mold 1102 can correspond to the shape of the bend limit layer 800, when the bend limit layer is in its designed limit radius configuration. Then, the adjacent segments 802 of the bend limit layer 800 can be formed as a unified part within the mold 1102, however, with imperfections along the designed boundaries 1104 between adjacent segments 802. The imperfections then can allow the unified part to be cracked along the designed boundaries between the adjacent segments, so that after the bend limit layer 800 is removed from the mold 1102 and flattened the bend limit layer 800 has the separated adjacent segments 802 shown in FIG. 8A, but when the bend limit layer 800 is bent to its limit radius, the adjacent segments form strong, rugged contacts to their adjacent segments.

Figure 12:
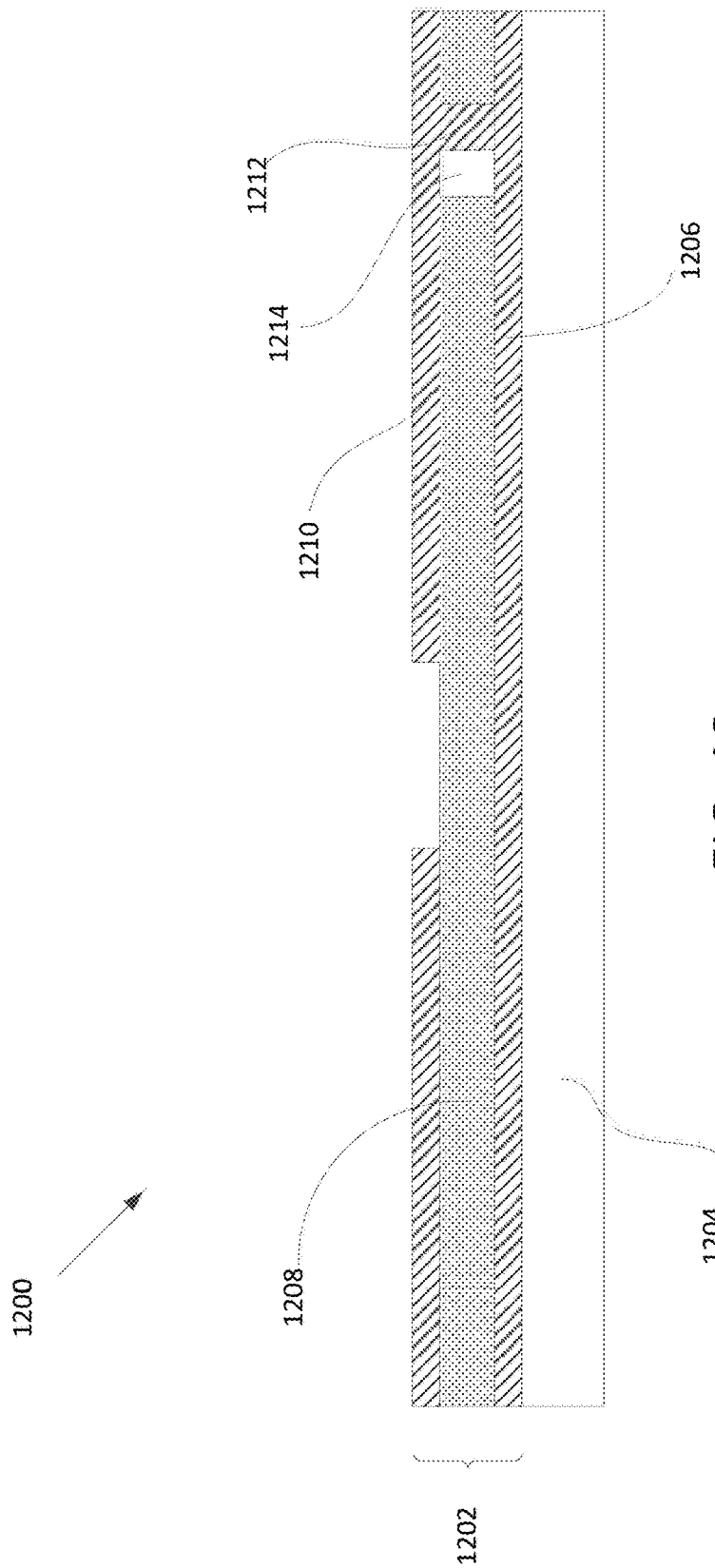
FIG. 12 is a schematic diagram of another implementation of the foldable display, in which a bend limit layer is coupled to a display layer.

FIG. 12 is a schematic diagram of another implementation of the foldable display 1200, in which a bend limit layer 1202 is coupled to a display layer 1204. The bend limit layers 1202 can include a plurality of sublayers. The sublayers can include, for example an outer layer 1206, a middle layer 1208, and an inner layer 1210. The inner layer 1210 can include one or more fingers 1212 that extends outward toward the outer layer 1206 and that, when the bend limit layer 1202 is in a relaxed, unbent configuration, are each horizontally separated by a gap 1214 in the plane of the layers from a portion of the middle layer 1208 that is closest to the middle of the bend into which the bend limit layer 1202 can be bent. Two fingers 1212 and gaps 1214 are shown in FIG. 12, but any number of fingers and corresponding gaps is possible.

The layers can be made of different materials. In one implementation the inner and outer layers 1210, 1206 can be made of an easily deformable, low stiffness metal, such as a nickel titanium alloy (e.g., Nitinol), and the middle layer can be made of a stiffer metal, such as stainless steel. The middle layer can be thicker than the inner and outer layers.

Figure 13:
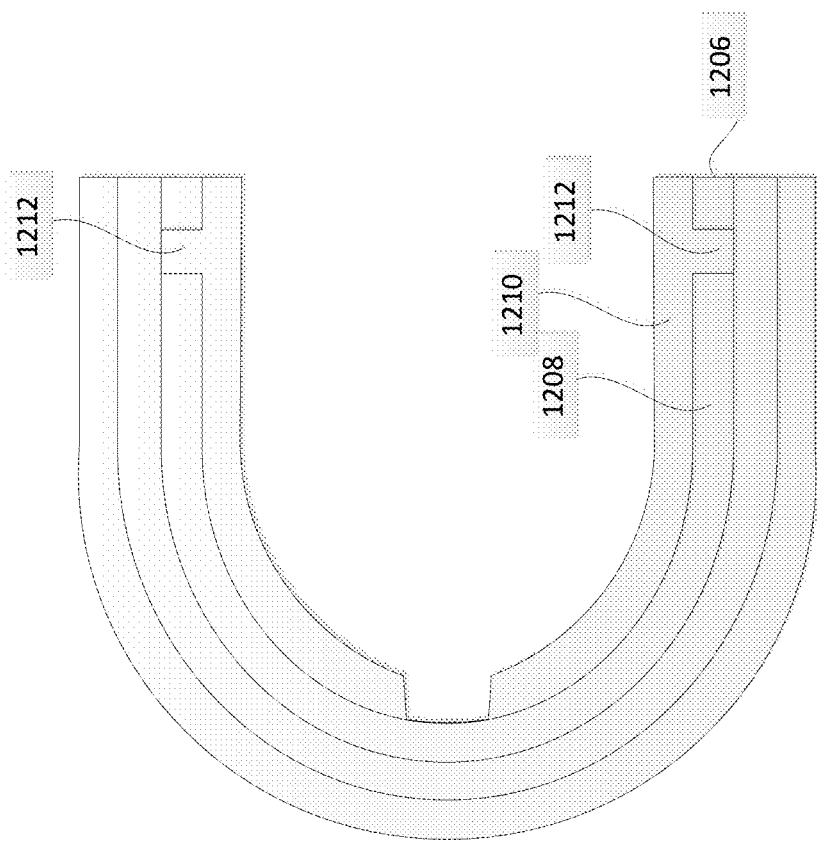
FIG. 13 is a schematic diagram of the foldable display when it is in a bent configuration.

FIG. 13 is a schematic diagram of the foldable display 1200 when it is in a bent configuration. As shown in FIG. 13, compressive strain on the inner layer at the apex of the bend due to the bending of the foldable display causes the gaps 1214 between the fingers 1212 of the inner layer and the middle layer to be closed. Thus, the sections of the inner layer 1210 can act as leaves that move across the inner layer in response to the compressive strain and that pull their corresponding fingers with them. When the gaps 1214 are closed, the stiffness of the bend limit layer 1202 increases, so that further bending of the foldable display is restricted.

Figure 14:
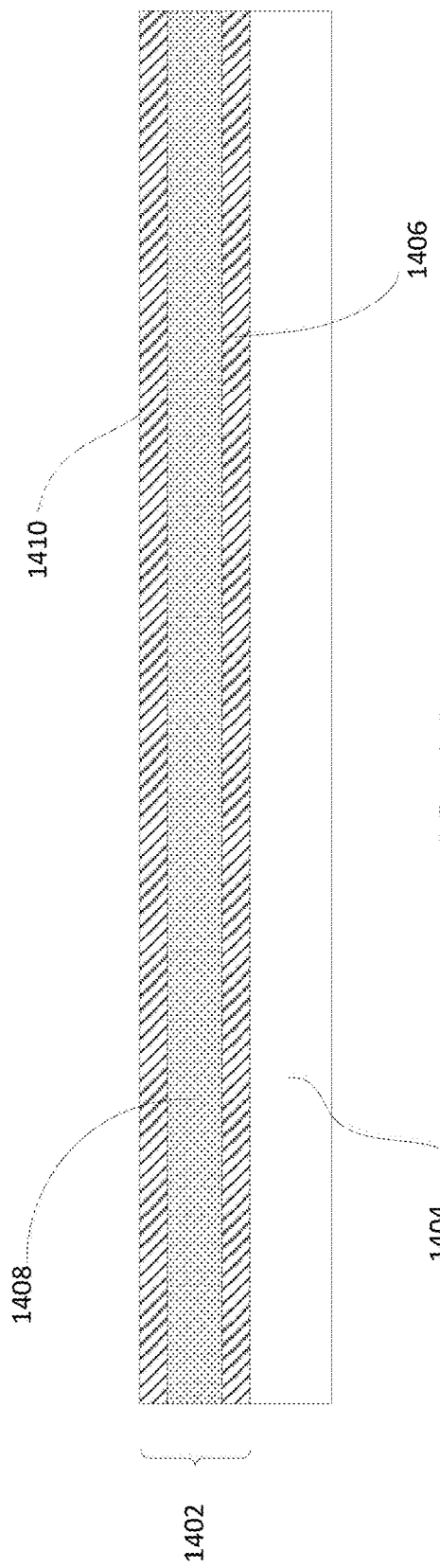
FIG. 14 is a schematic diagram of another implementation of a display in which a bend limit layer is coupled to a display layer.

FIG. 14 is a schematic diagram of another implementation of the display 1400 in which a bend limit layer 1402 is coupled to a display layer 1404. The bend limit layers 1402 can include a plurality of sublayers. The sublayers can include, for example, an outer skin layer 1406, a middle layer 1408, and an inner skin layer 1410. The layers can be made of different materials. In one implementation, the inner and outer layers 1410, 1406 can be made of very thin layer of a material with very high elongation (e.g. Nitinol film), and the middle layer can be made of material whose stiffness changes as a function of the bend radius of the foldable display 1400.

Figure 15:
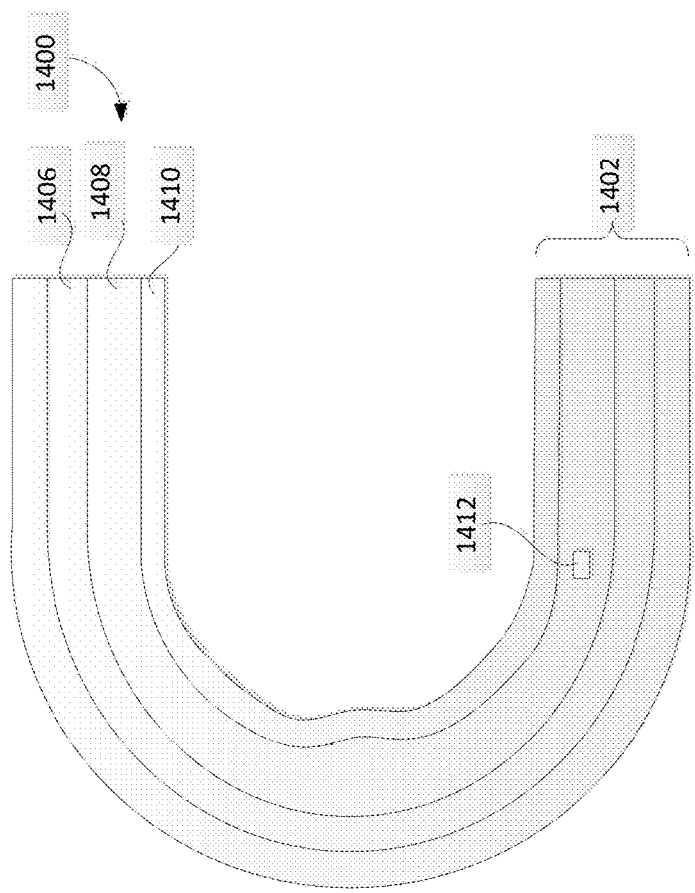
FIG. 15 is a schematic diagram of the foldable display when it is in a bent configuration.

FIG. 15 is a schematic diagram of the foldable display 1400 when it is in a bent configuration. As shown in FIG. 14, compressive strain on the inner layer 1408 due to the bending of the foldable display causes the stiffness of the middle layer 1408 to increase. This can occur in a number of different ways. In one implementation, the compressive strain on the inner layer 1410 and the middle layer 1408 causes the layers 1410, 1408 to deform inward toward the center of the bend, and the deformation of the material can increase the stiffness of the materials in the layers. In another implementation, the compressive strain on the inner layer 1410 and the middle layer 1408 causes a changes of state of an electromechanical device (e.g., a piezoelectric device) 1412 within at least one of the layers 1410, 1408.

In some implementations, electro-active material can be used in middle layer 1408, where the stiffness of the electro-active material can change in response to a voltage or current that is applied to the material. The electro-active material can include, for example, (1) ferroelectric-based materials (e.g., polyvinylidene fluoride-based ferroelectric citric polymer materials), (2) ionic-based material (e.g., ionomeric polymer-metal composites (e.g. Nafion or Flemion) or electroactive polymer gels), (3) non-ionic based materials, (e.g., poly vinyl alcohol-based materials); (4) carbon nanotube or conductive particles embedded in a polymer matrix, and (5) conductive polymer based materials (e.g., Polypyrrole, Polyaniline, Polythiophene, Polyacetelene, Poly-p-phenylene, Poly-phenylene vinylene. In some implementations, the electro-active material can change its rheological properties (such as storage modulus and/or loss modules) upon the application of an electric field. In some cases, the storage modulus of the material can be changed by more than 3 orders of magnitude by applying an electric field of a few kilovolts per millimeter to the material. In some cases, the form factor of the electro-active material can be changed upon the application of a voltage to bend, twist, expand, contract or shrink the material. The electric field and/or current can be applied to the electro active material by a dedicated electrode in the stack of the display device or by one or more electronic elements present in other structures of the device (e.g., electrodes in a touch layer of the device).

In some implementations, the compressive strain on the inner layer 1410 and the middle layer 1408 can cause a changes of state of an electromechanical device (e.g., a piezoelectric device) 1412 within at least one of the layers 1410, 1408, and a signal due to the change of state can be used to cause a change in the stiffness of the middle layer 1408. For example, an electrical signal from the electromechanical device 1412 in response to the bend-induced strain can trigger an electrical current or a voltage to be applied to the materials in the middle layer, which, in turn, can cause a change of state and stiffness of the material in the middle layer. For example, the material can change from a liquid to a solid in response to the applied current or voltage, or material can be pumped into the bent portion of the middle layer, or the orientation of particles of material can be rearranged in response to the applied current or voltage to increase the stiffness of the bent portion. Other modalities of changes to the stiffness of the electro-active material in response to an applied electric field or current are also possible.

Figure 16:
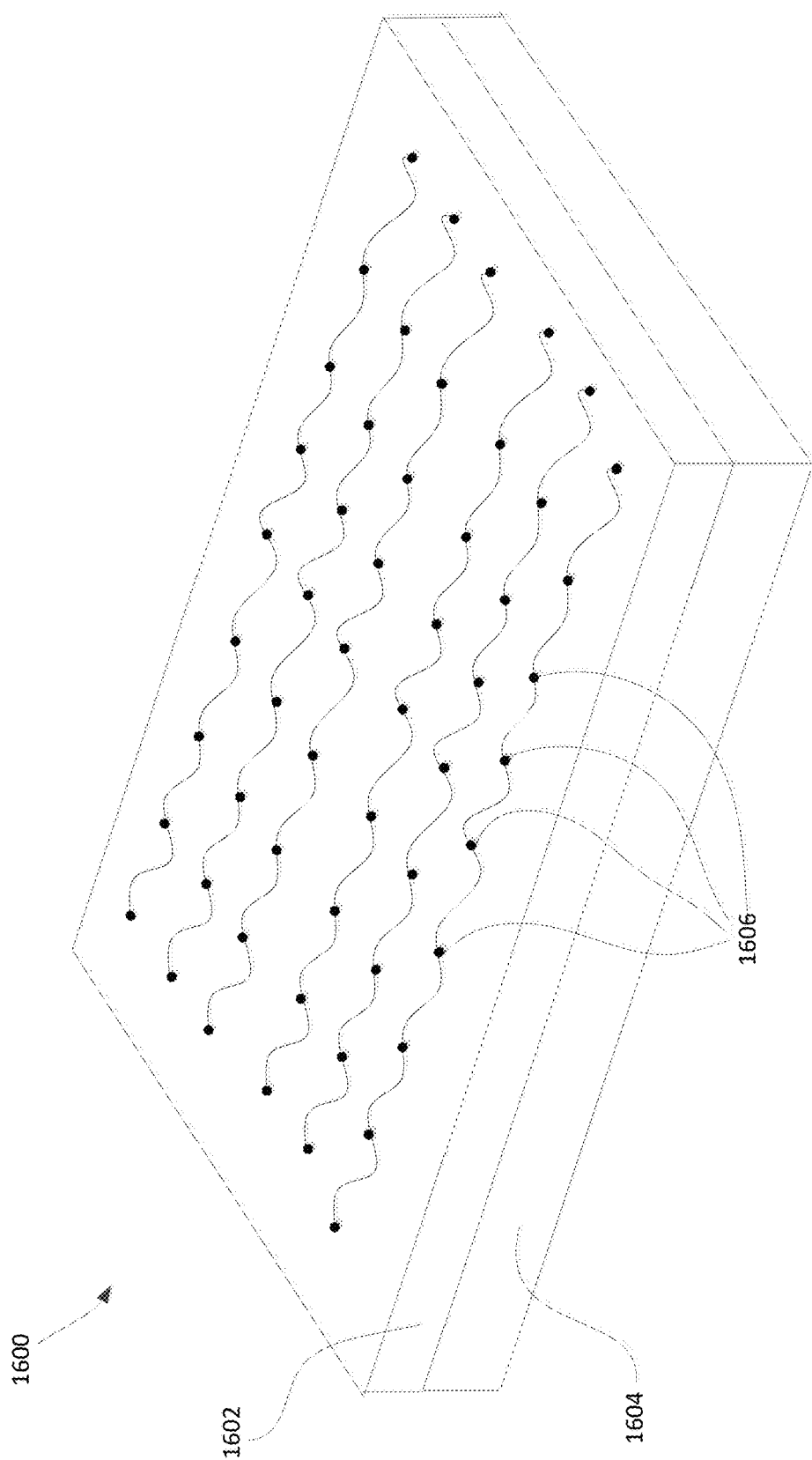
FIG. 16 is a schematic diagram of another implementation of a foldable display in which a bend limit layer is coupled to a display layer.

FIG. 16 is a schematic diagram of another implementation of the foldable display 1600 in which a bend limit layer 1602 is coupled to a display layer 1604. The content of the display can be displayed on a surface of the display that is on the opposite side of the foldable display 1600 from the bend limit layer 1602 (e.g., facing down, as shown in FIG. 16). The bend limit layer 1602 can include a plurality of threads or fibers arranged across the layer 1602 in a plane and that, when the bend limit layer 1602 is in a flat configuration, are arranged in a serpentine configuration, so that the length of each fibers is longer than the straight end-to-end distance in the plane between the ends of each fiber. The fibers can be made of strong, low-stretch material, such as, for example, fibers made from glass, Kevlar®, graphite, carbon fiber, ceramics, etc. and can be laid down in a low modulus substrate. For example, the fibers can be laid down via a spread tow technique in the desired pattern using specialized manufacturing equipment. The fibers can be pinned at locations 1606 along their lengths to a layer of the foldable display, e.g., to a substrate in the bend limit layer 1602 or to an surface at interface between the bend limit layer 1602 and the display layer 1604. For example, the fibers can be pinned at nodes of the serpentine configuration of the fibers. The pinning can be performed by a number of different techniques. For example, a laser heating process may bond the fibers at the pinning sites to the layer, or the fibers can be mechanically bonded at the sites.

The fibers can limit the bend radius of the foldable display 1600 when the display is bent, when the bend limit layer 1602 is on the outside of the bend and the display layer 1604 is on the inside of the bend, because the fibers can become straight and limit the bend radius of the foldable display when the desired minimum bend radius is reached. In other words, the resistance of the bend limit layer 1602 to tensile strain in the layer is very low while the fibers are unstretched and then becomes high when the fibers are stretched to their full lengths. With the fibers bonded to material in the bend limit layer 1602 at the pinning sites, a sudden increase in stiffness of the bend limit layer occurs when the bending of the bend limit layer 1602 causes the fibers to become straight between adjacent pinning sites 1606.

Figure 17:
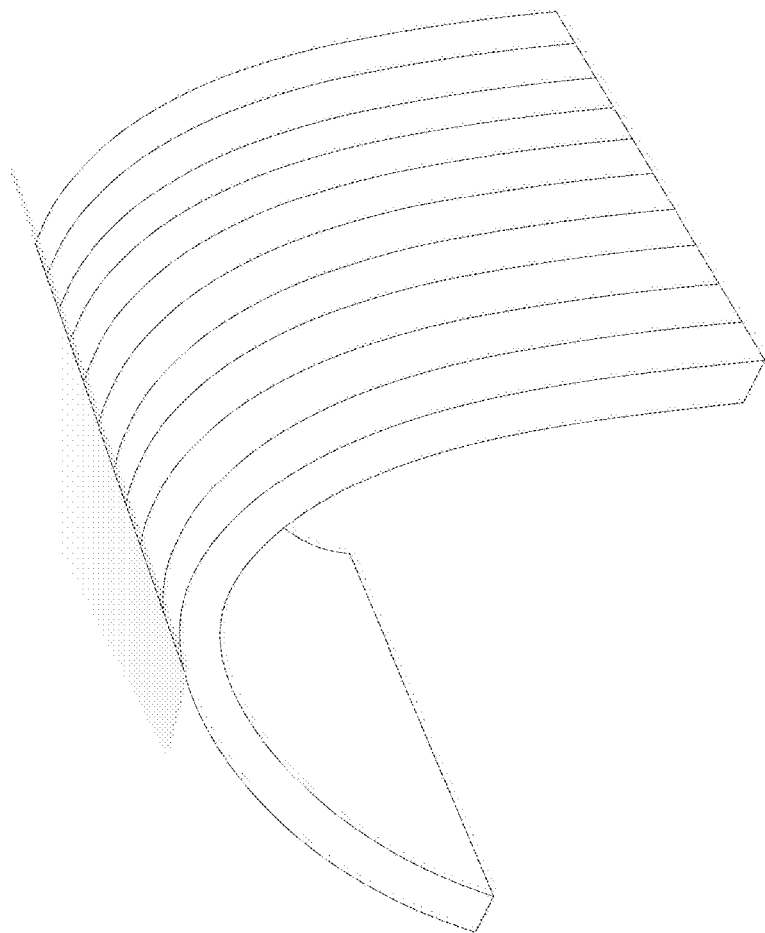
FIG. 17 is a schematic diagram of a foldable display when the display is in a bent configuration.

FIG. 17 is a schematic diagram of a foldable display 1600 when the display is in a bent configuration with the bend limit layer 1602 on the outside of the bend and with the display layer 1604 on the inside of the bend. In this configuration, when the bend limit layer is under tensile strain, the fibers can be become straight in the curved plane of the bend limit layer 1602, and the end-to-end distance, within the curved plane, of each fiber segment between adjacent pinning sites 1606 can be close to, or the same as, the length of each fiber between the adjacent pinning sites 1606. In this configuration the strong, low-stretch fibers resist the tensile strain on the bend limit layer, and thereby limit the bend radius of the foldable display 1600.

Figure 18:
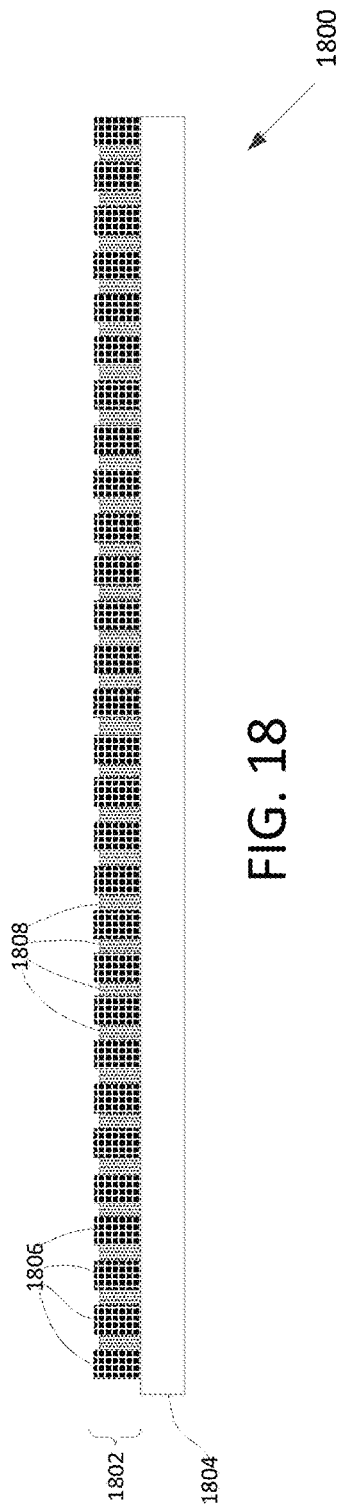
FIG. 18 is a schematic diagram of another implementation of a foldable display in which a bend limit layer is coupled to a display layer.

FIG. 18 is a schematic diagram of a foldable display device with a bend limit layer having a patterned structure of materials that can have a non-linear stiffness response to compressive forces caused by bending of the bend limit layer.

In one implementation, the patterned structure can include an array of ribs 1806 that extend away from the display layer 1804. As shown in FIG. 18, the ribs 1806 can be rectangular shaped, but other shapes are also possible. The ribs 1806 can be relatively rigid, in that they have a high bulk modulus and a high shear modulus. Therefore, the ribs 1806 retain their shape when the foldable display 1800 is bent. The ribs can include a variety of different rigid materials, including, for example, metals (e.g., aluminum, copper, steel, etc.) ceramic materials, glass materials, etc.

Gaps or trenches 1808 between adjacent ribs 1806 can be partially or fully filled with a second material that has a non-linear stiffness response to compressive forces caused by bending of the foldable display 1800. The material can include a foam (e.g., and open cell foam), a gel, or other material whose bulk modulus changes as a function of the compressive forces on the material.

When the bend limit layer 1802 is in a relaxed, unbent configuration, as shown in FIG. 18, the material in the gaps 1808 between the ribs 1806 can have a low bulk modulus and a low stiffness. For example, in the relaxed unbent configuration, the gaps 1808 can be filled with the non-linear stiffness material. The distance between adjacent ribs at the distal ends of the ribs (i.e., away from the display layer 1804) can be approximately equal to the distance between adjacent ribs 1806 at the proximate ends of the ribs (i.e. closest to the display layer 1804).

Figure 19:
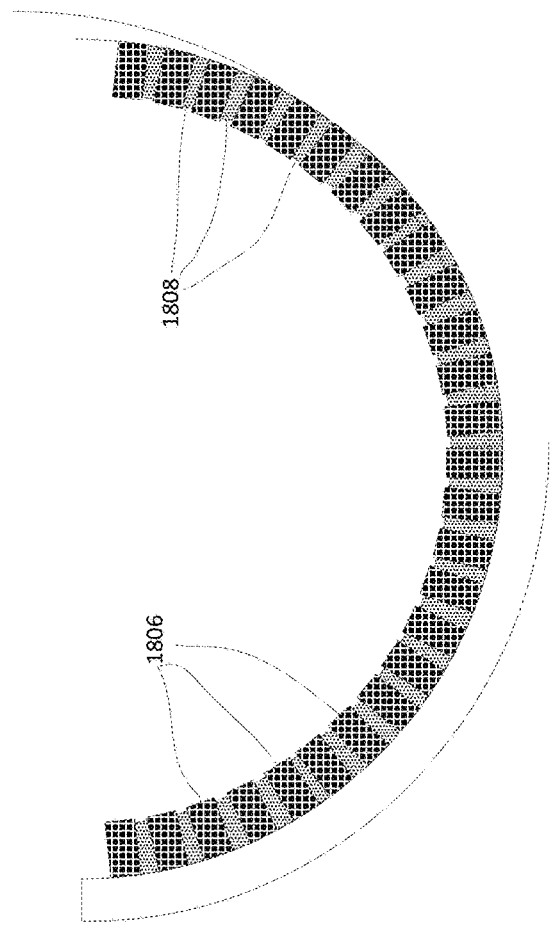
FIG. 19 is a schematic diagram of the foldable display when it is in a bent configuration.

FIG. 19 is a schematic diagram of the foldable display 1800 when it is in a bent configuration. As shown in FIG. 19, compressive strain at the interface of the display layer 1804 and the bend limit layer 1802 layer can cause the distance between adjacent ribs 1806 at the proximate ends of the ribs to be less than when the bend limit layer 1802 is in its relaxed, unbent configuration. In addition, because of the bend of the bend limit layer 1802 and the non-zero length of the ribs the distance between adjacent ribs at the distal ends of the ribs 1806 is even shorter when the bend limit layer 1802 is in the bent configuration than when in the unbent configuration. Consequently, the material in the in gaps or trenches 1808 between the ribs 1806 is squeezed when the layer 1802 is bent. The squeezing of the material can cause a sudden increase in the stiffness of the material when the radius of the bend becomes less than a threshold radius. For example, in the case of an open cell foam material in the gaps 1808 between the ribs 1806, air can be squeezed out of the cells when the material is compressed, and when a critical amount of air has been squeezed from the material when the radius reaches the threshold radius, then the stiffness of the material can suddenly increase.

Figure 20A:
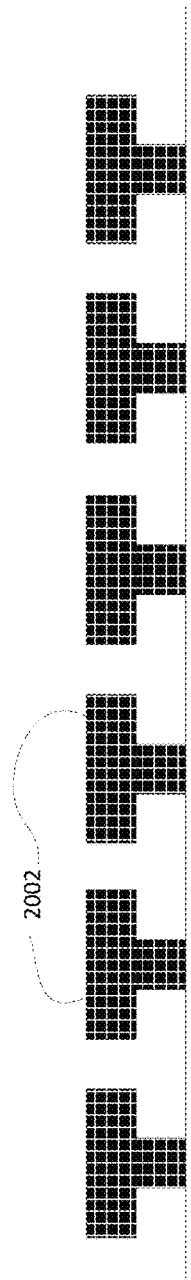
FIGS. 20A, 20B, 20C, 20D are schematic diagrams of details of the foldable display of FIGS. 18 and 19.
Figure 20B:
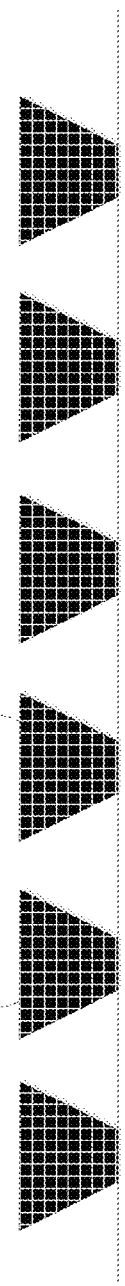
Figure 20C:
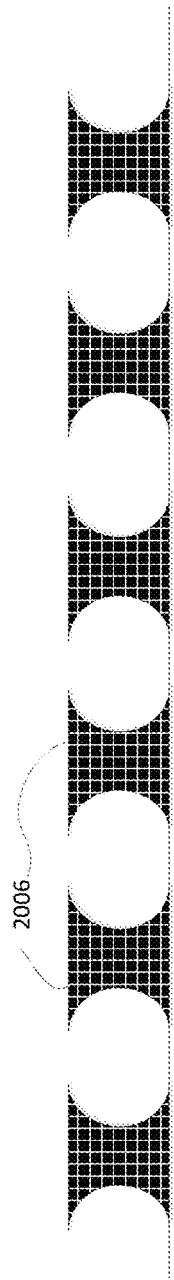
Figure 20D:
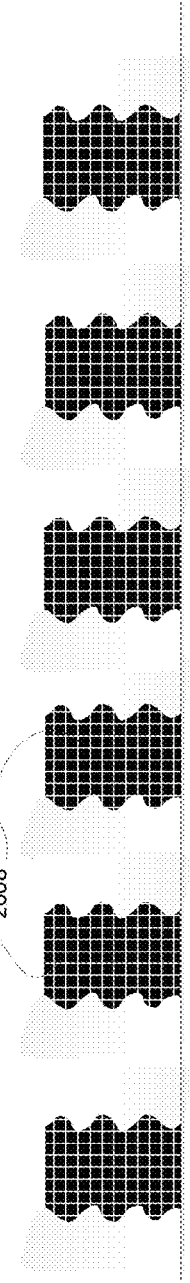

Although rectangular ribs 1806 are illustrated in FIGS. 18 and 19, and rectangular gaps 1808 between the ribs 1806 are shown in FIG. 18, other shapes of both the ribs and the material in the gaps between the ribs are possible. For example, as shown in FIG. 20A, ribs 2002 can be generally T-shaped profile. In another example, as shown in FIG. 20B, ribs 2004 can have a generally trapezoid-shaped profile. In another example, as shown in FIG. 20C, ribs 2006 can have a profile that is narrower in the middle than at the top and the bottom of the ribs. In another example, as shown in FIG. 20D, ribs 2008 can have a custom shaped profile that is configured, in conjunction with the type and shape of the material in the gaps between the ribs to accomplish a desired stiffness vs. bend radius response.

Figure 21A:
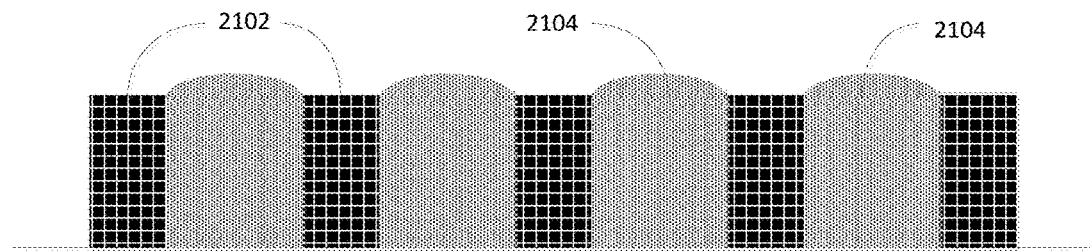
FIGS. 21A, 21B, 21C, and 21D are schematic diagrams of details of the foldable display of FIGS. 18 and 19.
Figure 21B:
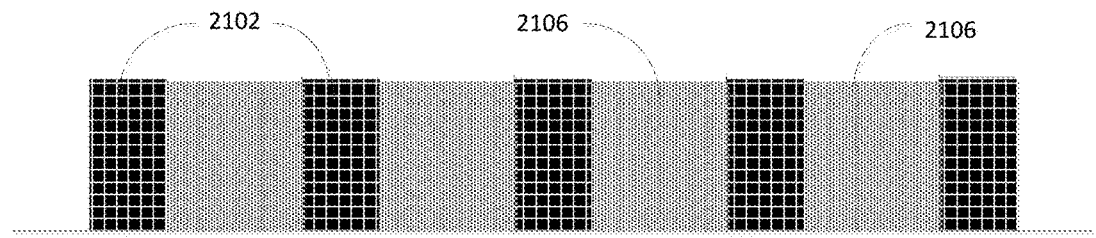
Figure 21C:
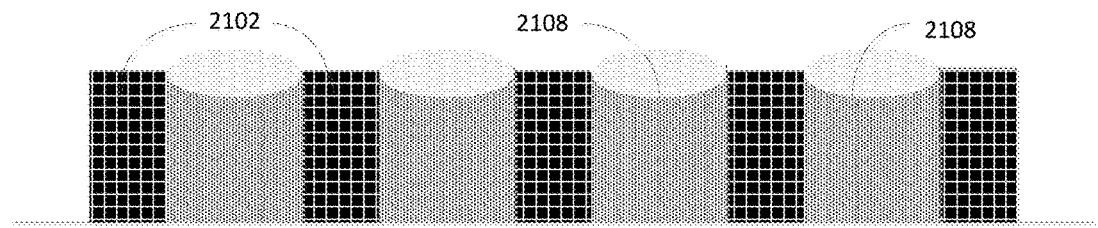
Figure 21D:
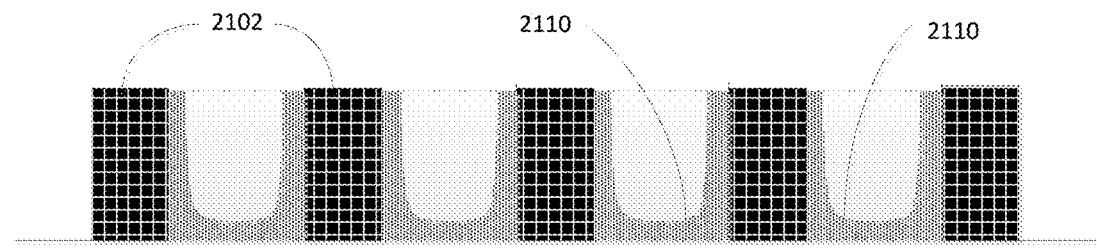

Correspondingly, the shape of the materials in the gaps between the ribs, which materials have a non-linear stiffness response to the radius of curvature of the bend limit film, can have different shapes. For example, FIGS. 21A, 21B, 21C, and 21D show rectangular gaps between rectangular ribs 2102, but with the materials in the gaps having different shapes in the different figures. For example, as shown in FIG. 21A, the rectangular gaps can be filled with non-linear stiffness response material 2104 that bulges above the tops of the gaps when the bend limit layer is in its relaxed configuration. In another example, as shown in FIG. 21A, the rectangular gaps can be filled with non-linear stiffness response material 2106 that precisely fills the rectangular gaps when the bend limit layer is in its relaxed configuration. In another example, as shown in FIG. 21C, the rectangular gaps can be filled with non-linear stiffness response material 2108 that descends below the tops of the gaps when the bend limit layer is in its relaxed configuration. In another example, as shown in FIG. 21D, the rectangular gaps can be filled with non-linear stiffness response material 2110 along the sides and bottom of the gaps, but on in the central portion of the gaps. The type and shape of the material in the gaps between the ribs can be selected to accomplish a desired stiffness response to the bend radius response of the bend limit layer.

Figure 22:
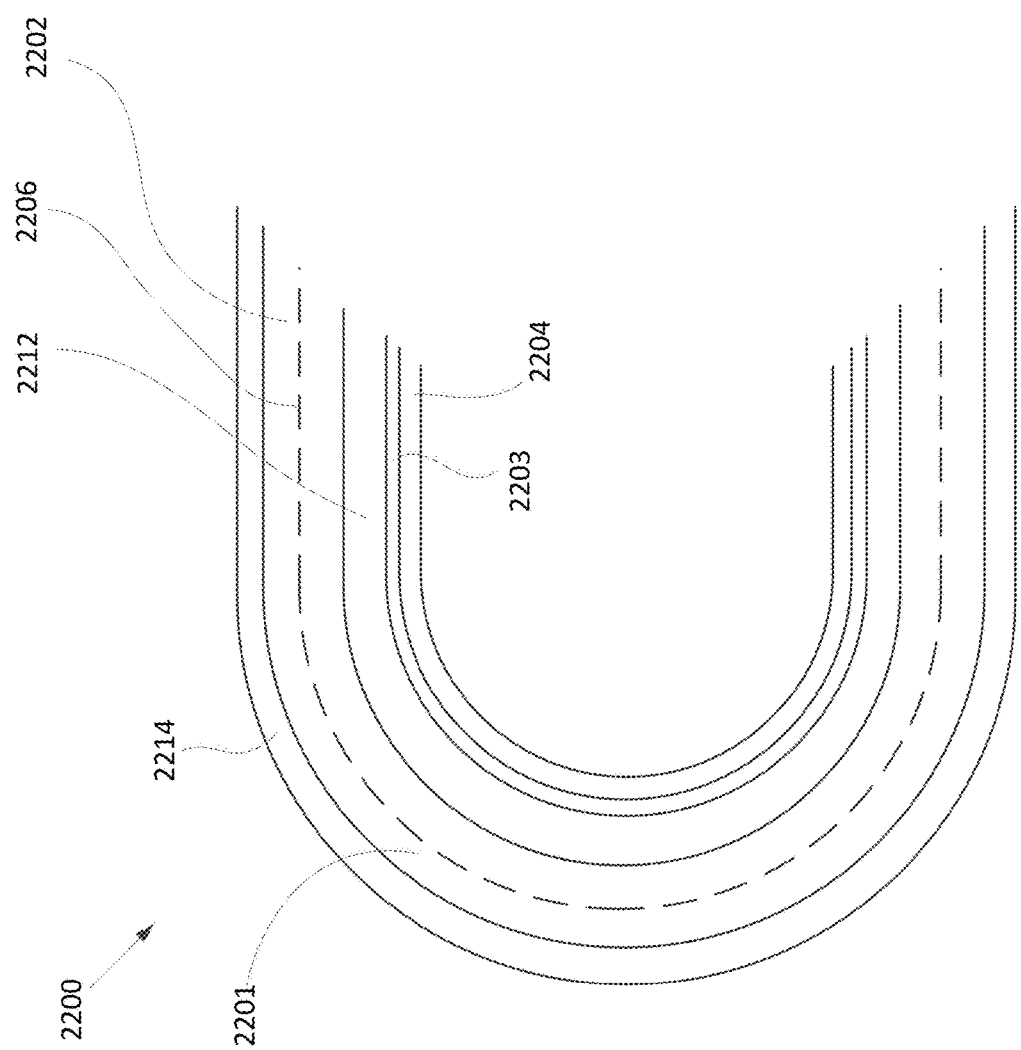
FIG. 22 is a schematic diagram of a foldable display having a bendable section that is bent around a minimum radius, $R_{min}$.

FIG. 22 is a schematic diagram of a foldable display 2200 having a bendable section 2201 that is bent around a minimum radius, $R_{min}$. The foldable display 2200 can include an OLED layer 2202 that includes components (e.g., OLED layers, TFT layers, touch screen layers, etc.) that generate images on the foldable display and a bend limit layer 2204 that limits the radius at which the foldable display 2200 can bend to greater than or equal to the minimum radius, $R_{min}$. The display 2200 also includes a high-modulus back stiffening layer 2212 and a high-modulus frontplate layer 2214. The bend limit layer 2204 can be coupled to the OLED layer 2202 by a coupling layer 2203. The coupling layer 2203 can include, for example, an adhesive material or a bonding material on respective surfaces that touch the OLED layer 2202 and the bend limit layer 2204.

As described above, when the OLED layer 2202 is fabricated in a flat configuration, bending the OLED layer 2202 induces compressive strain along the inner radius of the bend, and tensile strain is induced along the outer radius of the bend. It is desirable to keep the neutral plane 2206 of the assembly, at which no stain occurs in response to the bending, at, or close to, the plane in which fragile and sensitive components of the assembly (e.g., TFTs) exist. Thus, the coupling layer 2203 can include low modulus material (e.g., rubber, gel, etc.), so that little strain within the planes of the layers is transmitted between the OLED layer 2202 and the bend limit layer 2204. The display 2200 can include a high-modulus back stiffening layer 2212 and/or a high-modulus frontplate layer 2214 on the opposite sides of the OLED layer 2202 that function to maintain the neutral plane close to its designed location within the OLED layer 2202 when the bend limit layer 2204 acts to limit the bend radius of the display 2200. For example, the layers 2212, 2214 can have stiffnesses compensate for the effect of the stiffness of the bend limit layer on the position of the neutral plane, so that the neutral plane does not shift from its designed location in the OLED layer 2202 when the OLED layer 2202 is coupled to the bend limit layer 2204.

The devices and apparatuses described herein can be included as part of a computing device, that includes, for example, a processor for executing instructions and a memory for storing the executable instructions. Specific structural and functional details disclosed herein are merely representative for purposes of describing example embodiments. Example embodiments, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term and/or includes any and all combinations of one or more of the associated listed items.

It will be understood that when an element is referred to as being connected or coupled to another element, it can be directly connected or coupled to the other element or intervening elements may be present. In contrast, when an element is referred to as being directly connected or directly coupled to another element, there are no intervening elements present. Other words used to describe the relationship between elements should be interpreted in a like fashion (e.g., between versus directly between, adjacent versus directly adjacent, etc.).

The terminology used herein is for the purpose of describing particular embodiments only and is not intended to be limiting of example embodiments. As used herein, the singular forms a, an and the are intended to include the plural forms as well, unless the context clearly indicates otherwise. It will be further understood that the terms comprises, comprising, includes and/or including, when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

It should be borne in mind, however, that all of these and similar terms are to be associated with the appropriate physical quantities and are merely convenient labels applied to these quantities. Unless specifically stated otherwise, or as is apparent from the discussion, terms such as processing or computing or calculating or determining of displaying or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Lastly, it should also be noted that whilst the accompanying claims set out particular combinations of features described herein, the scope of the present disclosure is not limited to the particular combinations hereafter claimed, but instead extends to encompass any combination of features or embodiments herein disclosed irrespective of whether or not that particular combination has been specifically enumerated in the accompanying claims at this time.

What is claimed is:

1. A foldable display of a computing device, the foldable display comprising:
   a back stiffening layer;
   a transparent frontplate layer;
   a touch layer disposed between the back stiffening layer and the transparent frontplate layer;
   a transparent cover window layer; and
   an OLED display layer disposed between the back stiffening layer and the transparent frontplate layer, the OLED display layer characterized by a Young's modulus that is lower than the Young's modulus of the transparent frontplate layer and that is lower than the Young's modulus of the back stiffening layer, wherein the OLED display layer is configured to be bent repeatedly to a radius of less than 10 mm, and
   wherein mechanical properties of the back stiffening layer and the frontplate layer are controlled, such that a neutral plane of the foldable display is located within the middle 50% of the OLED display layer.

2. The foldable display of claim 1, wherein the mechanical properties of the back stiffening layer and the frontplate layer include thicknesses, densities, material compositions of the layers.

3. The foldable display of claim 1, wherein the transparent frontplate layer includes glass fibers and polymer materials.

4. The foldable display of claim 1, wherein the OLED display layer and the touch layer are fabricated as a single layer.

5. The foldable display of claim 4, wherein there are no layers between the back stiffening layer and the single layer.

6. The foldable display of claim 4, wherein there are no layers between the transparent frontplate and the single layer.

7. The foldable display of claim 1, wherein a neutral plane of the foldable display is located within a middle 20% of the OLED display layer.

8. The foldable display or claim 1, further comprising an optically clear adhesive layer between the OLED display layer and the transparent frontplate layer.

9. The foldable display of claim 1, wherein the foldable display is configured to be folded at a first location in a first direction and is configured to be folded at a second location in a second direction that is opposite to the first direction.

10. A computing device comprising:
    memory configured for storing executable instructions;
    a processor configured for executing the instructions;
    a foldable display configured for displaying information in response to the execution of the instructions, the foldable display including:
       a back stiffening layer;
       a transparent frontplate layer;
       a touch layer disposed between the back stiffening layer and the transparent frontplate layer;
       a transparent cover window layer;
       an OLED display layer disposed between the back stiffening layer and the transparent frontplate layer, the OLED display layer characterized by a Young's modulus that is lower than the Young's modulus of the transparent frontplate layer and that is lower than the Young's modulus of the back stiffening layer, wherein the OLED display layer is configured to be bent repeatedly to a radius of less than 10 mm, wherein mechanical properties of the back stiffening layer and the frontplate layer are controlled, such that a neutral plane of the foldable display is located within the middle 50% of the OLED display layer; and
       a bend limit layer arranged substantially parallel to the OLED display layer, the bend limit layer configured to increase its stiffness non-linearly when a radius of a bend of the bend limit layer is less than a threshold radius of curvature of the foldable display, the threshold radius of curvature being greater than 1 mm and less than 20 mm.

11. The computing device of claim 10, further comprising a coupling layer disposed between the bend limit layer and the OLED display layer, the coupling layer having a Young's modulus lower than the Young's modulus of the OLED display layer.

12. The computing device of claim 10, wherein the bend limit layer includes a material having a coefficient of thermal expansion within 50% of the coefficient of thermal expansion of the OLED display layer.

13. The computing device of claim 10, wherein the bend limit layer includes a material having a coefficient of thermal expansion within 25% of the coefficient of thermal expansion of the OLED display layer.

14. The computing device of claim 10, wherein an overall thickness of the foldable display is less than one millimeter.

15. The computing device of claim 10, wherein the OLED display layer and the touch layer are fabricated as a single layer.

16. The computing device of claim 10, wherein a neutral plane of the foldable display is located within a middle 20% of the OLED display layer.

17. The computing device of claim 10, further comprising an optically clear adhesive layer between the OLED display layer and the transparent frontplate layer.

18. The computing device of claim 10, wherein the foldable display is configured to be folded at a first location in a first direction and is configured to be folded at a second location in a second direction that is opposite to the first direction.

* * * * *